US008972751B2

(12) United States Patent
Perry et al.

(10) Patent No.: US 8,972,751 B2
(45) Date of Patent: *Mar. 3, 2015

(54) FIELD-PROGRAMMABLE GATE ARRAY POWER SUPPLY SYSTEM DESIGNER

(75) Inventors: Jeffrey R. Perry, Cupertino, CA (US); Martin Garrison, San Jose, CA (US); Dien Mac, San Jose, CA (US); Howard Chen, Santa Clara, CA (US); Phil Gibson, Sunnyvale, CA (US); Thomas Jewell, Santa Clara, CA (US)

(73) Assignee: National Semiconductor Corporation, Santa Clara, CA (US)

(*) Notice: Subject to any disclaimer, the term of this patent is extended or adjusted under 35 U.S.C. 154(b) by 699 days.

This patent is subject to a terminal disclaimer.

(21) Appl. No.: 13/169,419

(22) Filed: Jun. 27, 2011

(65) Prior Publication Data

US 2011/0320848 A1 Dec. 29, 2011

Related U.S. Application Data

(60) Provisional application No. 61/359,217, filed on Jun. 28, 2010.

(51) Int. Cl.
*G06F 1/26* (2006.01)
*G06F 17/50* (2006.01)

(52) U.S. Cl.
CPC .................................. *G06F 17/505* (2013.01)
USPC .................. 713/300; 703/1; 703/18; 716/100

(58) Field of Classification Search
USPC ......... 713/300; 703/1, 18; 716/110, 116, 120, 716/133, 100
See application file for complete search history.

(56) References Cited

U.S. PATENT DOCUMENTS 6,110,213 A * 8/2000 Vinciarelli et al. ............... 703/1
6,678,877 B1   1/2004 Perry et al.
(Continued)

OTHER PUBLICATIONS

Perry J.: "Designing Multiple Load System Power Supplies," Power Electronics Europe. Power Supply Design, No. 2, Mar. 2010, pp. 27-29.
Regenhold R: "Multistage Industrial Power Supply Design Made Easy," Electronic Product News, No. 40057, Mar. 26, 2010.
(Continued)

*Primary Examiner* — Chun Cao
(74) *Attorney, Agent, or Firm* — Andrew Viger; Frederick J. Telecky, Jr.

(57) ABSTRACT

A system may include a database configured to store information including characteristics of a plurality of components. The system may further include a server in communication with the database and configured to receive design parameters indicative of a plurality of loads of a multiple-load device; determine a plurality of power supply architectures that may be used to provide power supply solutions satisfying the plurality of loads, each power supply architecture including at least one position requiring a component configured to satisfy a load requirement; for each one of at least a subset of the plurality of power supply architectures, determine, based on the characteristics of the plurality of components, at least one component configured to satisfy the corresponding load requirement for each position of the one of the power supply architectures; and generate at least one power supply design in accordance with the power supply architectures and the determined components.

19 Claims, 18 Drawing Sheets

(56) References Cited

U.S. PATENT DOCUMENTS

| | | | |
|---|---|---|---|
| 6,847,853 B1* | 1/2005 | Vinciarelli et al. | 700/97 |
| 7,103,434 B2* | 9/2006 | Chernyak et al. | 700/98 |
| 7,966,588 B1* | 6/2011 | Perry et al. | 716/100 |
| 2009/0228845 A1* | 9/2009 | Ito et al. | 716/4 |
| 2010/0191512 A1* | 7/2010 | Sato | 703/1 |

OTHER PUBLICATIONS

Anonymous: "National Enters Power Module Market," Power Electronics Europe. Automotive Power, No. 1, Feb. 2010.

PCT International Search Report dated Nov. 9, 2011 for PCT/US2011/042023.

* cited by examiner

FIELD-PROGRAMMABLE GATE ARRAY POWER SUPPLY SYSTEM DESIGNER

CROSS-REFERENCE TO RELATED APPLICATIONS

This application claims the benefit of U.S. Provisional Patent Application Ser. No. 61/359,217, filed Jun. 28, 2010, entitled "FIELD PROGRAMMABLE GATE ARRAY POWER SUPPLY SYSTEM DESIGNER," the contents of which is hereby incorporated by reference in its entirety.

BACKGROUND

Field programmable gate arrays (FPGAs) are integrated circuits (ICs) designed to be configured by end users rather than being hard-wired to a particular circuit during manufacturing. FPGAs generally have a programmable core including a plurality of logic array blocks as well as reconfigurable interconnects to allow the logic blocks to be wired together in various configurations. The logic array blocks may include logic gates, flip-flops or other memories, and/or more sophisticated elements such as embedded multipliers. FPGAs may further include various clock circuits and input/output circuits.

The core, input/output circuits, and other powered elements of an FPGA present multiple loads that must be powered by a power supply. In other words, FPGAs are typically multiple-load devices. In some cases, there may be numerous (e.g., on the order of ten or even more) different loads in an FPGA to be powered, each having its own voltages and current requirements. The FPGA loads may place further restrictions on the power supply circuitry according to additional parameters and requirements, such as maximum ripple voltage, low dropout regulator, low pass filter, separate supply, monotonic startup behavior, minimum and maximum startup times, and the use of a specific switching frequency. FPGA power supplies may have still further constraints, such as sequencing requirements such that the different loads start up and shut down in a specific order.

In addition to these functional requirements, additional design parameters such as power supply efficiency, component and printed circuit board footprint size, and overall component cost are considerations when designing a power supply solution for an FPGA. Because of the numerous loads and other constraints, creating and optimizing a power supply for multiple-load devices such as FPGAs may be a long and tedious process.

BRIEF DESCRIPTION OF THE DRAWINGS

FIG. 11 illustrates an exemplary user interface illustrating additional generated power supply designs added by submitting additional design requirements configured to optimize the power supply designs for different values of key parameters.

DETAILED DESCRIPTION

Figure 1:
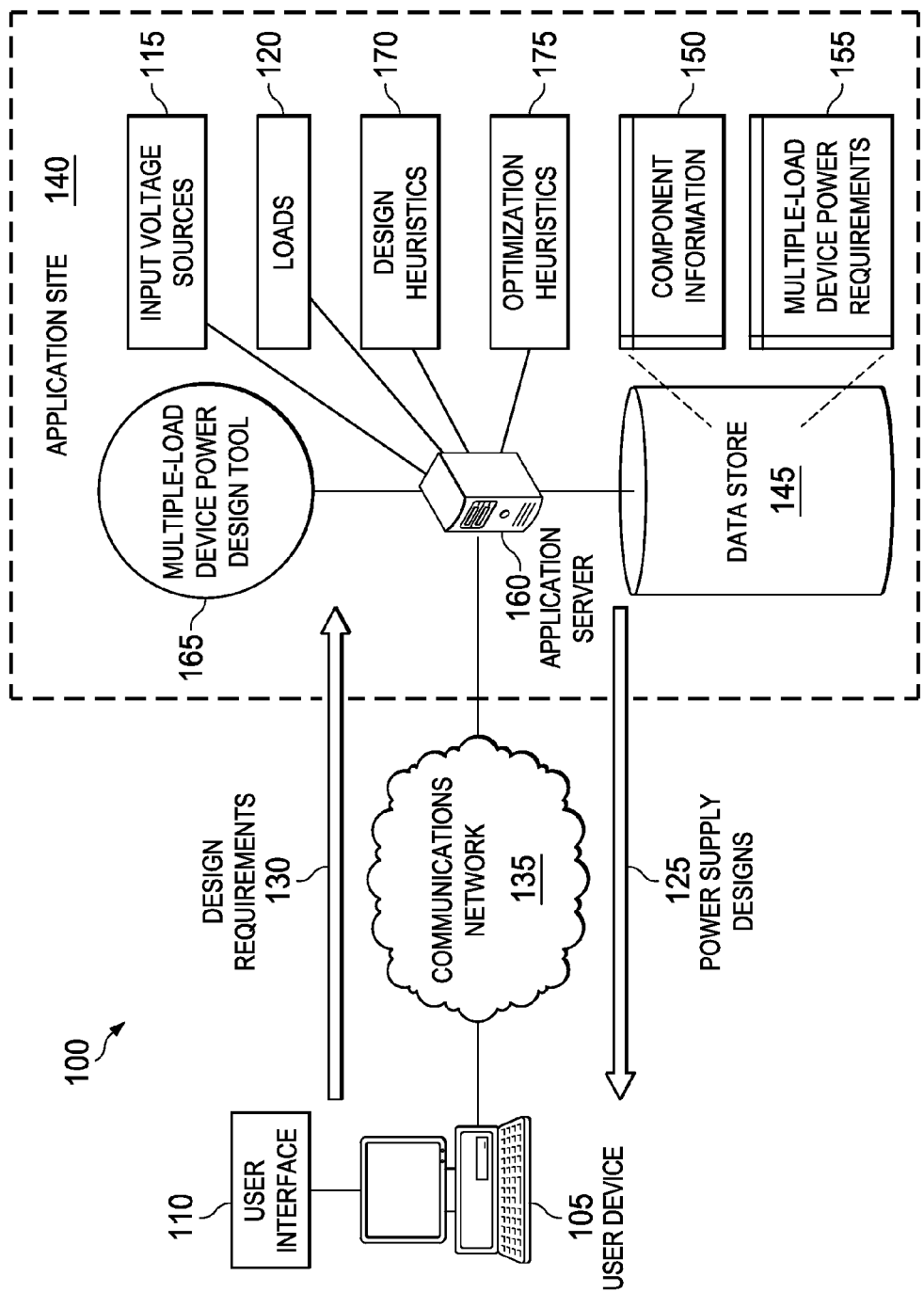
FIG. 1 illustrates an exemplary system for determining power supply solutions for multiple-load devices.

For a single load, a manufacturer of power supply components may be able to supply on the order of dozens of possible designs that satisfy a given set of power supply requirements. These design solutions may include various power supply components and supporting components to allow the power supply components to function for the particular application. Additionally, these different design solutions may take up different footprints, have different electrical efficiency ratings, and have different component costs.

Comparing each of the possible designs solutions by hand to determine an appropriate power supply design may require significant work. For example, using the WEBENCH Power Designer provided by National Semiconductor, a user may create each power supply design individually, simulate each individual design, and compare the resultant simulations to one another to determine which design appears best. Depending on the number of possible designs, and the number of loads requiring power, this process may take many days or weeks.

To overcome these and other deficiencies in existing design tools, a design tool may be implemented that is configured to generate solutions on a dynamic basis, based on a request for solutions to power multiple loads. The design tool may dynamically compute a multitude of power supply design architectures that can power the set of loads, where each power supply architecture includes positions at which components configured to satisfy load requirements are determined. Using the generated power supply design architectures and a database of component information, the design tool may utilize various heuristics to determine a set of different solutions capable of powering the set of multiple loads.

Components may be added or removed from the database of component information to allow for the dynamic creation of different solutions. Further, because the solutions are created dynamically upon user request, the generated solutions are always up-to-date based on the component information in the database.

The design tool may further optimize the generated designs in accordance with additional design parameters, such as power supply efficiency, component and printed circuit board footprint size, and overall component cost. The system may also provide a capability for graphical comparison and analysis of the resulting design solutions.

FPGAs are an example of devices that may require a power supply design that can handle multiple loads. However, multiple load devices such as FPGAs may impose additional power supply constraints or restrictions upon their power supply designs, in addition to requiring appropriate voltage and adequate current for a set of loads. A multiple-load device power design tool may account for these further restrictions on the power supply circuitry by taking into account additional parameters and requirements. As some examples, the multiple-load device power design tool may receive design requirements including: maximum ripple voltage, low dropout regulator, low pass filter, separate supply for particular loads, monotonic startup behavior, minimum and maximum startup times, sequencing requirements such that the different loads start up and shut down in a specific order, and use of a particular switching frequencies regulators in the power supply design. To allow for quick and accurate specification of these design requirements, the multiple-load device power design tool may be preconfigured with a listing of multiple-load devices (such as FPGAs or Microprocessors) and their associated load requirements.

Based on the design requirements, the multiple-load device power design tool may determine a variety of different power supply architectures which may be appropriate to power the loads of the multiple-load device. Using the power supply architectures, the multiple-load device power design tool may determine a set of power supply solutions. Moreover, due to the particular additional load requirements specified for the multiple-load device, the multiple-load device power design tool may further account for these additional constraints to the power supply design to allow for the determined power supply solutions to meet the additional requirements specified by the inputs.

The multiple-load device power design tool may further provide a sequencing function to allow a user to change the order of start up and shut down of the power supplies. This sequencing may be required because a multiple-load device such as an FPGA or a microprocessor may require certain loads to be powered up or down before other loads are powered up or down. For instance, the sequencing function may allow the user to specify a time delay between when different power supplies start up and shut down. Given this information, the multiple-load device power design tool may calculate any additional parts, such as additional ICs or other circuit components that may be required to support the sequencing behavior. These additional components may then be accounted for in the proposed power supply solutions.

While power supplies for FPGAs are illustrated herein, it should be noted that the multiple-load device power design tool is not limited to designing power supplies for FPGAs. Rather, the multiple-load device power design tool may be used to design power supplies configured to power a set of multiple loads for any type of device or devices requiring multiple loads. For example, power supplies for other types of devices, such as microprocessors or other application-specific integrated circuits, may also be determined using the disclosed multiple-load device power design tool.

FIG. 1 illustrates an exemplary system 100 for determining power supply solutions for multiple-load devices. As illustrated in FIG. 1 the exemplary system includes a user device 105 configured to provide a user interface 110, where the user interface 110 is configured to receive design requirements 130 relating to at least one input voltage source 115 and a plurality of loads 120 and display a set of power supply designs 125. The system 100 further includes a communications network 135 in selective communication with the user device 105 and an application site 140. The application site 140 includes a data store 145 configured to store component information 150 and multiple-load device power requirements 155. The application site 140 further includes an application server 160 configured to run a multiple-load device power design tool application 165. The multiple-load device power design tool application 165 may receive the design requirements 130, and may produce the set of power supply designs 125 responsive to the design requirements 130, relevant design heuristics 170 and optimization heuristics 175, as well as selected component information 150 and multiple-load device power requirements 155 from the data store 145. System 100 may take many different forms and include multiple and/or alternate components and facilities. While an exemplary system 100 is shown in FIG. 1, the exemplary components illustrated in Figure are not intended to be limiting. Indeed, additional or alternative components and/or implementations may be used.

The user device 105 may be a device configured to be operated by one or more users, such as a cellular telephone, laptop computer, tablet computing device, personal digital assistant, or desktop computer workstation, among others. The user device 105 may include one or more components capable of receiving input from a user, and providing output to the user.

The user interface 110 may be an interface configured to allow for the effective operation and control of the user device 105. The user interface 110 may further provide feedback and other output to the user to aid the user in making operational decisions with respect to the user device 105. Exemplary user interfaces 110 may include input devices such as keyboards, buttons, and microphones, and output devices such as display screens and loudspeakers. As a particular example, a user interface 110 may be implemented by way of one or more web pages displayed by the user device 105 by way of a web browser software program. Such a web-based user interface 110 may accept input from a user by way of one or more controls on a web page and may provide output by displaying web pages to the user including feedback or other outputs of the system 100. As another example, a user interface 110 may be implemented by way of a self contained rich internet application (RIA) utilizing an engine such as Adobe Flash, where the RIA may accept input from a user by way of one or more controls and provide output that may be viewed by the user on the user device 105.

An input voltage source 115 may be a device or system that produces or derives an electromotive force between its terminals. Input voltage sources 115 may be defined according to the voltage and maximum current draw they provide, and may further be defined according to a name to aid in identification. A load 120 may be an electrical or other circuit that requires electrical power to operate. Loads 120 may be defined as a required voltage and maximum current draw. Loads 120 may further be defined according to a name to aid in their identification. A power supply may be a source of electrical power, and a power supply design 125 may be a circuit including various components that draw power from one or more input voltage sources 115 and supply electrical energy to at least one load 120.

The design requirements 130 may include information regarding a set of two or more loads 120 to be powered by one or more input voltage sources 115. The information may include minimum, maximum, and nominal input voltage, ambient temperature, maximum input current, and other design inputs about one or more input voltage sources 115. The information may also include details of the loads 120 to be powered, such as voltage, current, name, and other power supply attributes of the loads 120. In some examples, the design requirements 130 may include indications of one or more multiple-load devices for which power should be supplied, such as one or more FPGAs or microprocessors.

The communications network 135 may include a mixture of wired (e.g., fiber and copper) and wireless mechanisms that incorporate related infrastructure and accompanying network elements. Illustrative communication networks 135 may include the Internet, an intranet, the Public Switched Telephone Network (PSTN), and a cellular telephone network. The communications network 135 may include multiple interconnected networks and/or sub-networks that provide communications services, including data transfer and other network services to at least one user device 105 connected to the communications network 135.

The communications network 135 may be in selective communication with an application site 140. The application site 140 may be a hosting platform, such as a web hosting platform, configured to make applications available over the communications network 135. To perform the hosting functions, the application site 140 may include computing devices such as one or more data stores 145 and application servers 160.

The data store 145 may include one or more data storage mediums, devices, or configurations, and may employ various types, forms, and/or combinations of storage media, including but not limited to hard disk drives, flash drives, read-only memory, and random access memory. The data store 145 may include various technologies useful for storing and accessing any suitable type or form of electronic data, which may be referred to as content. Content may include computer-readable data in any form, including, but not limited to video, image, text, document, audio, audiovisual, metadata, and other types of files or data. Content may be stored in a relational format, such as via a relational database management system (RDBMS). As another example, content may be stored in a hierarchical or flat file system. In particular the data store 145 may store content including component information 150 and multiple-load device power requirements 155. Notably, the component information 150 and multiple-load device power requirements 155 are information with respect to individual components and multiple-load devices only, not completed designs, solutions, or formulations.

The component information 150 may include information on the individual components, such as power supply regulators (e.g., switching regulators, low drop out regulators (LDOs), switched capacitors or other types of voltage regulators), capacitors, resistors, diodes, etc. Component information 150 may be received from manufacturers or suppliers in various forms, such as parts information sheets, parts catalogs, schematics, among others. The received component information 150 may be formatted and saved into the data store 145 for use in determining designs. Exemplary component information 150 may include part cost, whether the part is in stock, part dimensions and footprint, pin configuration, minimum and maximum ranges of operation, light output, heat sink requirements, efficiency information, graphs of various characteristics of operation, among other exemplary characteristics. Notably, the component information 150 includes information about the components themselves, not the components in combination with other components.

The multiple-load device power requirements 155 may include detailed information on individual multiple-load devices related to their associated power loads 120. Multiple-load device power requirements 155 may be received from manufacturers or suppliers in various forms, such as parts information sheets, parts catalogs, schematics, among others. The received multiple-load device power requirements 155 may be formatted and indexed into the data store 145. Exemplary multiple-load device power requirements 155, such as those for an FPGA or microprocessor, may include voltage, current, and name information for each of the loads 120 for the multiple-load device, as well as further restrictions on the power to be supplied to the loads 120, such as requirements with respect to maximum ripple voltage, a low dropout regulator, a low pass filter, a separate supply, monotonic startup behavior, minimum and maximum startup times, sequencing requirements such that the different loads 120 start up and shut down in a specific order, switching frequency, part cost, whether the part is in stock, part dimensions and footprint, pin configuration, minimum and maximum ranges of operation, light output, heat sink requirements, efficiency information, graphs of various characteristics of operation, among other exemplary characteristics. Notably, the multiple-load device power requirements 155 include information about the multiple-load devices themselves, not the multiple-load devices in combination with other components or devices.

The application site 140 may further include an application server 160. The application server 160 may be implemented as a combination of hardware and software, and may include one or more software applications or processes for causing one or more computer processors to perform the operations of the application server 160 described herein.

A multiple-load device power design tool application 165 may be one application included on the application server 160, wherein the multiple-load device power design tool application 165 may be implemented at least in part by instructions stored on one or more computer-readable media. The multiple-load device power design tool application 165 may include instructions to cause the application server 160 to receive design requirements 130, query the data store 145 for component information 150 and multiple-load device power requirements 155 related to the design requirements 130, produce a set of power supply designs 125 responsive to the design requirements 130, component information 150 and multiple-load device power requirements 155, and return the power supply designs 125 for further analysis and use.

The multiple-load device power design tool application 165 may utilize design heuristics 170 when determining the set of power supply designs 125 responsive to the design requirements 130. Design heuristics 170 may include rules related to the generation of different power supply architectures which may be appropriate to power the loads 120 specified by the design requirements 130. The design heuristics 170 may allow for the generation of a plurality of power supply architectures indicating potential arrangements of components between the one or more input voltage sources 115 and the plurality of loads 120 specified by the design requirements 130. For example, a design heuristic 170 may be utilized to determine intermediate rail voltages for possible power supply architectures. As another example, a design heuristic 170 may be utilized to break down the plurality of loads 120 specified by the design requirements 130 into one or more groups with smaller total currents.

The multiple-load device power design tool application 165 may utilize optimization heuristics 175 when determining the set of power supply designs 125 responsive to the design requirements 130. Optimization heuristics 175 may be responsive to parameters indicative of tradeoffs between various design goals, and may be utilized to prefer one or more parameters over other parameters of a design. Design goals to be optimized by optimization heuristics 175 may include small component footprint, efficiency, cost, thermal dissipation, and power utilized, among others. As an example, an optimization heuristic 175 for designs with a smaller footprint may optimize for size by choosing components with relatively smaller footprints that still satisfy the design requirements 130, but at the expense of other parameters such as efficiency. As another example, an optimization heuristic 175 for designs with a higher efficiency may optimize by choosing components capable of being utilized at a relatively higher switching frequency while still satisfying the design requirements 130, but at the expense of other parameters such as cost.

Computer-executable instructions may be compiled or interpreted from computer programs created using a variety of well known programming languages and/or technologies, including, without limitation, and either alone or in combination, Java™, C, C++, Visual Basic, Java Script, Perl, PL/SQL, etc. The multiple-load device power design tool application 165 may accordingly be written at least in part according to a number of these and other programming languages and technologies, or a combination thereof.

In some instances, the multiple-load device power design tool application 165 is provided as software that when executed by a processor of the application server 160 provides the operations described herein. Alternatively the multiple-load device power design tool application 165 may be provided as hardware or firmware, or combinations of software, hardware and/or firmware. An exemplary modularization of the multiple-load device power design tool application 165 is discussed in further detail below with respect to FIG. 3.

In general, computing systems and/or devices, such as user device 105, application server 160, and data store 145 may employ any of a number of well known computer operating systems, including, but by no means limited to, known versions and/or varieties of the Microsoft Windows® operating system, the Unix operating system (e.g., the Solaris® operating system distributed by Sun Microsystems of Menlo Park, Calif.), the AIX UNIX operating system distributed by International Business Machines of Armonk, N.Y., and the Linux operating system. Examples of computing devices include, without limitation, a computer workstation, a server, a desktop, notebook, laptop, or handheld computer, or some other known computing system and/or device.

Computing devices, such as data store 145 and application server 160 generally include computer-executable instructions, where the instructions may be executable by one or more computing devices such as those listed above. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores, such as such as data store 145 described herein, may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners, as is known. A file system may be accessible from a computer operating system, and may include files stored in various formats. An RDBMS generally employs the known Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

While FIG. 1 illustrates an exemplary system 100, other implementations may be used. In some implementations, the system 100 may be implemented as an off-line or self-contained computing device based configuration. In such an implementation, the application server 160 and multiple-load device power design tool application 165 may be implemented by a back-end calculation engine running on the computing device. In some implementations, the multiple-load device power design tool application 165 may be executed by way of a self-contained RIA utilizing an engine such as Adobe Flash. For example, the RIA may be downloaded by a client from a server by way of a network such as the Internet or an intranet, and where most or substantially all of the calculations performed by the system 100 may be performed on the client using the RIA, without need to go back to the server again during a design session.

Further, in some implementations, additional elements may be included or elements shown in FIG. 1 may be omitted or modified. For example, one or more of the user device 105, data store 145, and application server 160 may be combined in certain implementations. As another example, a system may include multiple data stores 145 and/or application servers 160. In still further examples, multiple-load device power design tool application 165 may be implemented across multiple application servers 160. While communications network 135 is shown in the illustrated embodiment, in other embodiments the communications network 135 may be omitted entirely and the user device 105 may be connected directly to the application site 140. In still other examples, the multiple-load device power design tool application 165 may be executed in whole or in part by the user device 105.

Figure 2:
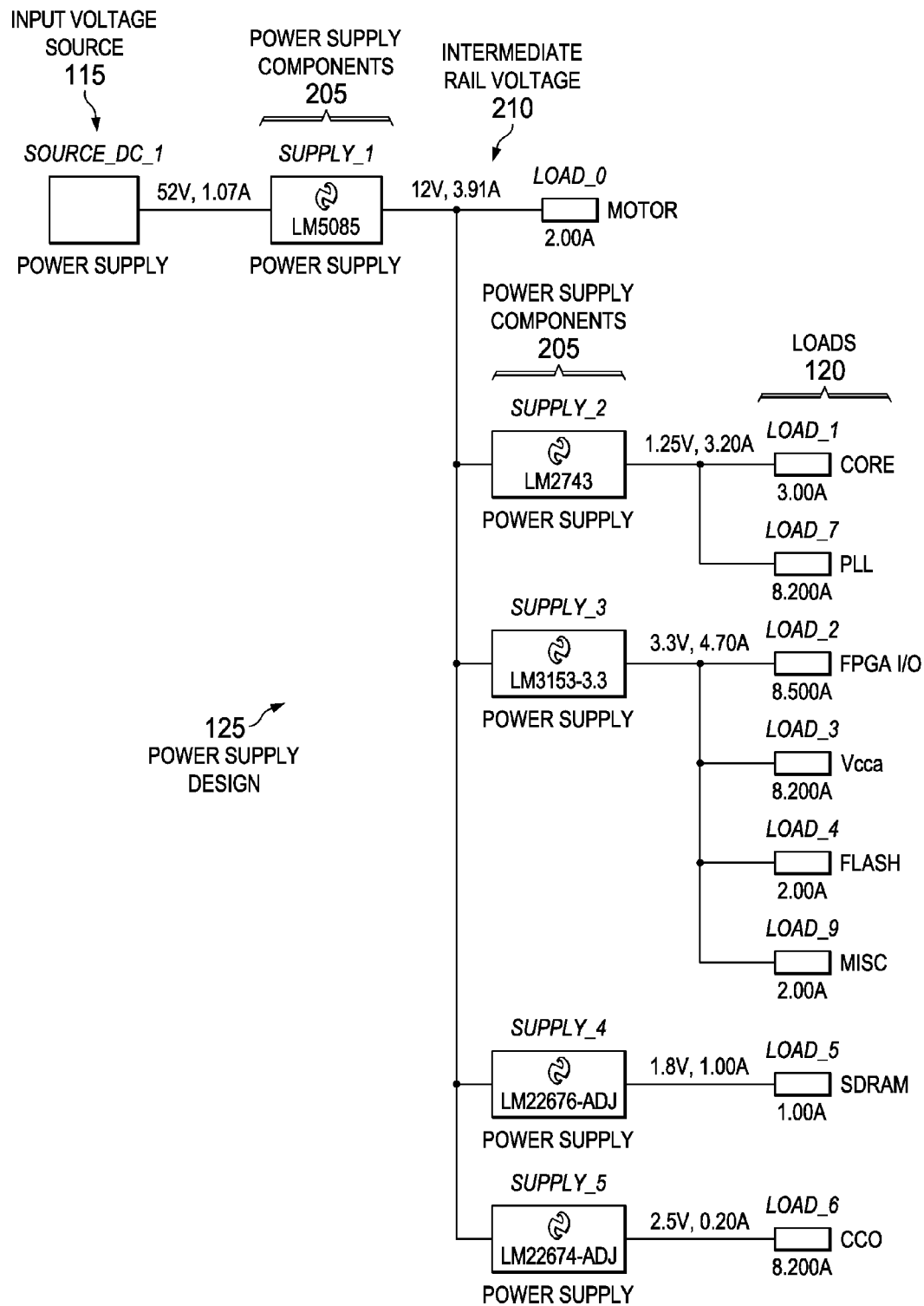
FIG. 2 illustrates an exemplary power supply design.

FIG. 2 illustrates an exemplary power supply design 125. As shown in FIG. 2, the exemplary power supply design 125 is powered by a single input voltage source 115, and provides power to the following set of loads 120: an FPGA core requiring 1.25V at 3.2 A, FPGA Input/Output requiring 3.3V at 0.5 A, Vcca requiring 3.3V at 0.2 A, Flash requiring 3.3V at 2 A, SDRAM requiring 1.8V at 1 A, CCD requiring 2.5V at 0.2 A, PLL requiring 1.25V at 3.2 A, and a Motor requiring 12V at 3.91 A. The power supply design 125 further includes a plurality of power supply components 205 to provide power to the loads 120 and also to an intermediate rail voltage 210. It should be noted that the exemplary power supply design 125 is only one of many possible power supply design 125 that may be used to power the illustrated set of loads 120.

A power supply component 205 may be a component such as a switching regulator controller configured to provide a regulated output at a specified voltage and current. A power supply component 205 may accordingly provide a regulated output at the specified voltage for up to a maximum amount of current.

An intermediate rail voltage 210 may provide an intermediate voltage levels between an input voltage source 115 and an output voltage for a load 120. The intermediate rail voltage 210 may be used as an input to a power supply component 205 configured to produce an output for one or more of the loads 120. An intermediate rail voltage 210 may be produced by way of a power supply component 205 configured to power the intermediate voltage level. Intermediate rail voltages 210 may require additional power supply components 205 to produce the intermediate rail voltages 210. However, the use of intermediate rail voltages 210 may allow for the use of more efficient, lower power, or lower cost power supply components 205 to supply the loads 120, where these power supply components 205 may not be usable or as efficient they were connected to the input voltage source 115 directly.

The exemplary power supply design 125 includes an LM5085 power supply component 205 configured to generate a 12V intermediate rail voltage 210, and a plurality of power supply components 205 utilize the 12V intermediate rail voltage 210 as an input to produce further regulated outputs for the set of loads 120. Additionally, the loads 120 requiring power at 12V in the exemplary power supply design 125 are powered by the intermediate rail voltage 210 directly.

Figure 3:
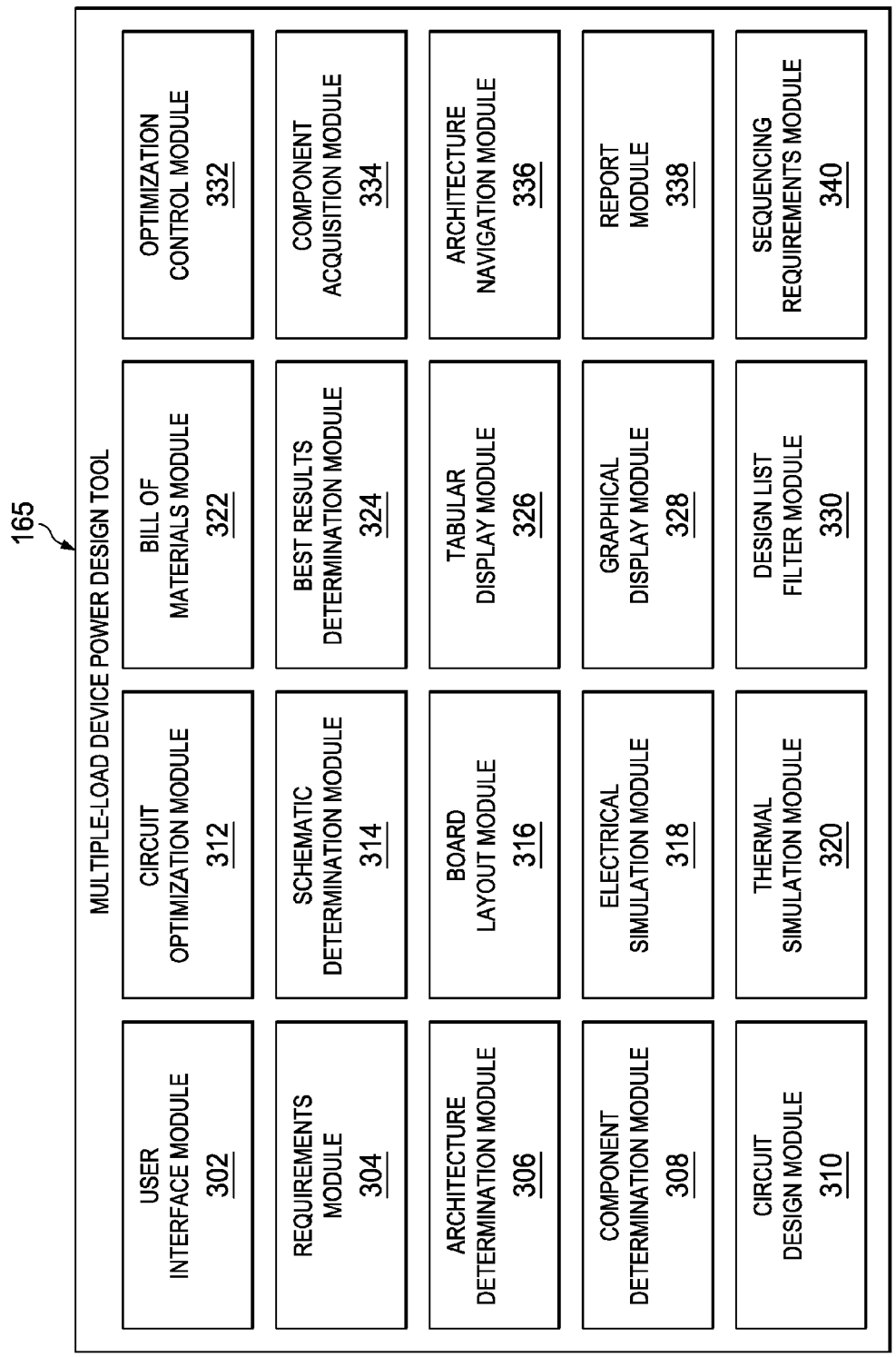
FIG. 3 illustrates an exemplary modularization of a multiple-load device power design tool application.

FIG. 3 illustrates an exemplary modularization of a multiple-load device power design tool application 165. As shown in the Figure, the multiple-load device power design tool application 165 may include a user interface module 302, requirements module 304, an architecture determination module 306, a component determination module 308, a circuit design module 310, a circuit optimization module 312, a schematic determination module 314, a board layout module 316, an electrical simulation module 318, a thermal simulation module 320, a bill of materials module 322, a best results determination module 324, a tabular display module 326, a graphical display module 328, a design list filter module 330, an optimization control module 332, a component acquisition module 334, an architecture navigation module 336, a report module 338, and a sequencing requirements module 340. Although only one example of the modularization of the multiple-load device power design tool application 165 is illustrated and described, it should be understood that the operations thereof may be provided by fewer, greater, or differently named modules.

The user interface module 302 may be configured to provide the user interface 110 to be displayed by way of the user device 105. For example, the user interface module 302 may be implemented by way of one or more web pages configured to accept the design requirements 130 from a user and provide output to the user including power supply designs 125. The user interface module 302 may be implemented using technologies such as Java, AJAX, Adobe Flex, Adobe Flash, Microsoft .NET, among others. The user interface module 302 may be configured to generate web pages via the application server 160 to be transmitted to the user device 105 via the communications network 135. These web pages may then be viewed by the user on the user device 105 using a web browser program.

Exemplary user interfaces 110 allowing for the specification of design requirements 130 and the viewing of power supply designs 125 are illustrated with respect to FIGS. 6-15 described below. It should be noted that the while specific user interfaces 110 are illustrated in the exemplary Figures, the particular user interfaces 110 presented by the multiple-load device power design tool application 165 and the user interface module 302 may vary from implementation to implementation.

The requirements module 304 may be configured to utilize the user interface module 302 to allow the user of the user device 105 to specify design requirements 130 for the power supply designs 125. For example, the requirements module 304 may cause the user interface module 302 to generate web pages configured for receiving the design requirements 130.

The requirements module 304 may be configured to allow a user to specify design requirements 130 including one or more input voltage sources 115. For example, a user may provide minimum, maximum, and nominal input voltage, ambient temperate, maximum input current and/or other critical design inputs about the input voltage source 115. The user may add additional input voltage sources 115 to the design requirements 130 if desired.

The requirements module 304 may further be configured to allow a user to specify design requirements 130 including a set of loads 120 to be provided power by the power supply design 125. For example, the user may provide voltage, current, name and other power supply attributes for one or more loads 120. The loads 120 may be assigned to a specific input voltage source 115 by a user if desired, or the loads 120 may be automatically assigned to input voltage sources 115.

To allow for quick and accurate specification of the design requirements 130, the requirements module 304 may utilize a preconfigured listing of multiple-load devices (e.g., FPGAs, microprocessors, etc.) and their associated voltage and current requirements for their respective loads 120, such as the multiple-load device power requirements 155 stored in data store 145. These multiple-load device power requirements 155 may include details of the power supply attributes and requirements for the multiple-load device that should be met to allow the device to function properly. These multiple-load device power requirements 155 indicate information on the device alone, not characteristics of the device in combination with other components. For example, attributes of an individual FPGA related to low noise, dedicated supply, synchronize to a frequency, maximum $V_{out}$ ripple, soft start time, may be included in the multiple-load device power requirements 155 for an FPGA. The requirements module 304 may provide for the selection of one or more desired devices (e.g., FPGAs, microprocessors, etc.), allowing the list of loads 120 in the design requirements 130 for the desired power supply designs 125 to be populated with the appropriate parameters from the multiple-load device power requirements 155. For example, upon selection of one of the multiple-load devices from the multiple-load device power requirements 155, the requirements module 304 may include the names, voltages, currents, as well as any other additional load 120 requirements for the chosen multiple-load device into the design requirements 130. The loads 120 for the multiple-load device may be added to the design requirements 130 together as a set. Alternately, a subset of the loads 120 for the multiple-load device may be added to the design requirements 130 individually.

While the preconfigured values for the multiple-load devices may be added to the list of desired loads 120 in the design requirements 130, the requirements module 304 may further allow the user to modify or edit the preconfigured values, if desired. As some examples, the requirements module 304 may allow for a user to edit load 120 requirements such as maximum ripple voltage, low dropout regulator, low pass filter, separate dedicated supply, monotonic startup behavior, minimum and maximum startup times and sequencing requirements such that the different loads 120 start up and shut down in a specific order. As another example, the requirements module 304 may allow for a user to specify synchronization of some or all of the supplies to a specific switching frequency. As yet another example, the requirements module 304 may allow a user to associate one or more loads 120 with different available input voltage sources 115.

Additionally, a user may further add additional user-specified loads 120 in addition to the loads 120 for the multiple-load device, such as an additional input voltage source 115 for another design component. Accordingly, a user may further add additional loads 120 to the design requirements 130 that are not affiliated with any multiple-load devices.

Based on the loads 120 and input voltage sources 115 specified by the design requirements 130, the architecture determination module 306 may determine a variety of different power supply architectures that may be appropriate to power the loads 120. The architecture determination module 306 may selectively group the loads 120 onto common supplies, as well as arrange power supplies between the input voltage source 115 and the various loads 120. Based on the groupings and arrangements, the architecture determination module 306 may define one or more positions into which power supply components 205 are to be included, as well as defining load requirements for each of the positions. For example, a load requirement for a position may be a requirement for a power supply component 205 to supply power to one or more loads 120. As another example, a load requirement for a position may be a requirement for a power supply component 205 to supply power to an intermediate rail voltage 210. As yet another example, a load requirement for a position may be a requirement for a power supply component 205 to supply power to one or more intermediate rail voltages 210 as well as to one or more loads 120.

Based on one or more design heuristics 170 of the system 100, the architecture determination module 306 may selectively combine loads 120 specified by the design requirements 130 into groups, where the grouped loads 120 may utilize a common power supply. As an example, one or more system 100 design heuristics 170 may specify for the architecture determination module 306 to group loads 120 with the same voltage together on a common power supply. The architecture determination module 306 may accordingly determine a load requirement for a position in a power supply architecture by summing the current requirements for each of the loads 120 in the group. However, the design requirements 130 may specify that a load 120 requires a unique supply, in which case that load 120 would not be grouped with other loads 120 on a common supply.

To determine when to group the loads 120, the one or more design heuristics 170 of the system 100 may specify a threshold current value above which it would be less likely to find a suitable component for a power supply. Accordingly, if a grouping of loads 120 results in a sum of the load 120 currents being above the threshold value, the architecture determination module 306 may break the loads 120 down into one or more groups, each with a smaller total current, to allow for a greater number of possible components to be available to provide power to the groups of loads 120. The architecture determination module 306 may accordingly determine load requirements for each position in a power supply architecture based on the summed current for each group.

Based on one or more design heuristics 170, the architecture determination module 306 may calculate one or more intermediate rail voltages 210. Using the calculated intermediate rail voltages 210, the architecture determination module 306 may generate various power supply architectures having zero or more intermediate rail voltages 210. Accordingly, power supply architectures including various intermediate rail voltages 210 may allow for the generation of power supply solutions having different characteristics and tradeoffs.

An example of an algorithm that may be utilized to calculate power supply architectures having intermediate rail voltage 210 may be to calculate appropriate intermediate rail voltages 210 according to the duty cycle of downstream regulators, targeting low, medium, and high duty cycle for the downstream supplies.

Another example of an algorithm that may be used to calculate power supply architectures having intermediate rail voltage 210 may be to set different percentages of the difference between the input voltage source 115 and the loads 120. Exemplary percentages for intermediate rail voltage 210 may include 75%, 50%, and/or 25% of the voltage of an intermediate rail voltage 210. For instance, if an input voltage source 115 is 50V, and one of the loads 120 requires a 10V supply, then possible power supply architectures may include 40V, 30V, or 20V intermediate rail voltage 210 (i.e., 75%, 50%, and 25% of the 40V difference between the 50V input voltage and the 10V load voltage).

Using the calculated intermediate rail voltage 210, the architecture determination module 306 may generate various power supply architectures. For each power supply architecture, the architecture determination module 306 may start at each load 120, or collection/group of loads 120, and sum up the currents. Then for each load 120 or group of loads 120, the architecture determination module 306 may determine to use the voltage of an intermediate rail voltage 210, if it exists, whose voltage is above that of a particular load 120. If no intermediate rail voltage 210 is present, then the architecture determination module 306 may utilize the input voltage source 115 as the input voltage for the supply for the load 120.

The architecture determination module 306 may accordingly determine a plurality of potential power supply architectures according to different combinations of input voltage sources 115 and intermediate rail voltages 210 with the loads 120 specified by the design requirements 130. Each of the determined power supply architectures may accordingly include one or more positions at which a power supply component 205 may be required. For each position, the architecture determination module 306 may determine a load requirement (e.g., voltage and current) for power supply components 205 that may fill the position.

For example, as shown in FIG. 2, there are five positions in which a power supply component 205 may be required, four of which provide power to loads 120 directly, and one of which also provides an intermediate rail voltage 210. Because the group of 1.25V volt supplies includes a load requiring 3 A and a load requiring 0.2 A, the power supply component 205 for the 1.25V position labeled "Supply_2" has a load requirement of 1.25V at 3.2 A. Similarly, the group of 3.3V loads at the position labeled "Supply_3" has a load requirement of 3.3V at 4.7 A.

The component determination module 308 may be configured to determine one or more power supply components 205 that could be used to build circuits for a given power architecture. For instance, for each of the potential power supply architectures determined by the architecture determination module 306, the component determination module 308 may determine power supply components 205 to provide power to one or more loads 120 or intermediate rail voltages 210.

More specifically, the component determination module 308 may determine a power supply component 205 that could satisfy the load requirements for a particular position by applying filters to component information 150 stored in data store 145. The load requirements may include output voltage and output current fields based on the grouped design requirements 130 for the loads 120. The filters may compare values specified in the load requirements against values in corresponding information in the component information 150.

As another example, the component determination module 308 may utilize values from the load requirements as inputs to formulas, where the outputs of the formulas are used to determine which power supply components 205 could potentially satisfy the load requirements for a particular position. For instance, when designing a boost regulator circuit, a formula may be used to determine which power supply components 205 used in boost regulators may meet the switch current requirements implicit in the load requirements for a particular position. Accordingly, to determine which power supply components 205 may be used in that position, the input voltage, output voltage and output current specified for the position may be used to calculate a required switch current rating, where the required switch current rating is compared against the switch current ratings in the component information 150 stored in data store 145 to select only those power supply components 205 that can satisfy the requirements for the position.

Thus, for each position in the power architecture in which a power supply components 205 would be required, a list of possible power supply components 205 for each position in the architecture may be determined. For example, as shown in FIG. 2, an LM2743 power supply component 205 may be used to meet the load requirements for the position labeled "Supply_2," and an LM3153-3.3 power supply component 205 may be used to meet the load requirements for the position labeled "Supply_3." In some examples, the component determination module 308 may further maintain a list of reasons for the exclusion of power supply components 205 that may be unsuitable for use in a particular position, so that a user may be informed why a particular power supply component 205 is not indicated as being available for use.

A circuit may contain many more supporting components in addition to a particular power supply component 205 that may be used to satisfy at least a subset of the design requirements 130. Based on the determined power supply components 205, the circuit design module 310 may be utilized to determine the supporting components, or parameters and bounds for the supporting components. The circuit design module 310 may further be configured to determine a circuit topology indicating how those additional supporting components may be arranged to create the circuit with the power supply components 205.

The circuit design module 310 may utilize design heuristics 170 and including various rules and mathematical formulas to select adequate values for the additional components. For example, if the design requirements 130 indicate that a load 120 is to be provided a minimal output voltage ripple, a design heuristic 170 may indicate that a larger output capacitor value may be chosen as a supporting component. As another example, if the design requirements 130 indicate that a power supply may be required to withstand sudden change in input voltage (i.e., transient response) then a design heuristic 170 may indicate that a smaller output capacitor value may be chosen as a supporting component.

In some instances, rather than determine a particular value for a supporting component, the circuit design module 310 may instead utilize design heuristics 170 determine a range of potential values for an additional component of the circuit. For example, for a certain design, an output capacitor must have a capacitance greater than or equal to 100 µF and an equivalent series resistance of less than or equal to 100 mΩ. These rules may then be used by the circuit design module 310 to select supporting components from the parts described in the component information 150 of the data store 145.

The circuit optimization module 312 may be configured to aid in the determination of power supply components 205 and supporting components. For example, the circuit optimization module 312 may determine supporting components that satisfy the range of potential values determined by the circuit design module 310, while also accounting for design preferences indicated in the design requirements 130 through use of optimization heuristics 175.

Parameters of a component part may be determined based on the component information 150 stored in the data store 145. Accordingly, selection of component parts for a design may be based on an algorithm in which a target value is set for the parameters of the component part. The closer a component parameter is to a target value, the higher the score for that parameter. A weight may also be assigned to each parameter of a component. Thus, a final score for each component may be determined based on the initial score and the weight (e.g., determined as a product of the initial score and the weight). If two parameters with a same deviation from a target value have different weights, the one with a higher weight would receive a higher overall score. This weighted scoring algorithm allows selection of components taking into account multiple parameters at once, keeping a balance between important characteristic factors of the component part such as footprint, parasitic resistance, capacitance, and inductance.

As an example, a design requirement 130 may indicate a preference for power supply designs 125 having high efficiency or low voltage ripple. Accordingly, an optimization heuristic 175 may set a low target for an equivalent series resistance (ESR) parameter of an output capacitor to reduce power dissipation and/or ripple. An optimization heuristic 175 may further set a high weighting for the ESR parameter in relation to other parameters. Using these optimization heuristics 175, capacitors with low ESR would typically achieve higher scores than capacitors with higher ESR, giving the resultant designs improved efficiency.

The optimization heuristics 175 may further allow consideration of other parameters, such as size, capacitance, price and part availability in order to determine an overall score for a component. As an example, design requirements 130 may indicate a preference for designs having high efficiency, low cost, and parts that are in stock. Accordingly, one or more optimization heuristics 175 may place a relatively higher weight on a part being in stock at a fulfillment warehouse, a relatively higher weight on a part having a low price, and a relatively higher weight on a part having a low ESR. In such an example, a capacitor having a low ESR, but being out of stock at the fulfillment warehouse and having a high price may receive a lower overall score than a part one that is in stock, less expensive, but with a higher ESR.

In some instances, one or more of the architecture determination module 306, the component determination module 308, the circuit design module 310, and the circuit optimization module 312 may utilize a cutoff to generate up to a maximum number of power supply designs 125. This cutoff may indicate a maximum total number of power supply designs 125 to include in the universe of possible solutions. In other instances, a cutoff may indicate a maximum number of power supply designs 125 per power supply architecture.

The schematic determination module 314 may be configured to produce a schematic diagram including the particular power supply components 205 and supporting components determined by the component determination module 308, circuit design module 310, and circuit optimization module 312. An exemplary schematic determination module 314 may be the schematic generator included in the WEBENCH Power Designer provided by National Semiconductor. In some examples, the schematic determination module 314 may be configured to generate a schematic that may be displayed to a user in a user interface 110 on a web page, by way of the user interface module 302.

For example, the schematic determination module 314 may be configured to draw an electrical schematic by way of the user interface module 302, using vector-based drawing techniques within a web browser application executed by a user device 105. The electrical schematic may show wires and components such as voltage regulator devices and capacitors. In some examples, the schematic determination module 314 may be configured to provide a scale adjustment to allow for a user to adjust the scale at while a schematic is drawn, and zoom in and out of the schematic.

The schematic determination module 314 may further be configured to draw feature blocks that represent collections of components in an included electrical schematic or sub-circuit, rather than drawing each individual component of a sub-circuit. For example, each position in a power supply architecture into which a power supply component 205 is included may be represented as a feature block in the schematic, rather than as a full schematic indicating each supporting component of the power supply component 205. As some further examples, a feature block may represent a sub-circuit configured to create an intermediate rail voltage 210, a sub-circuit configured to provide a power output to a load 120 from an intermediate rail voltage 210, or a sub-circuit configured to provide a power output to a load 120 from an input voltage source 115 directly.

In some instances, the schematic determination module 314 may be configured such that each sub-circuit configured to provide an intermediate rail voltage 210 and/or a power output for a load 120 may be represented as feature block in the electrical schematic. A schematic including such feature blocks would accordingly allow for a higher-level representation of the power supply design 125 to be displayed. The schematic determination module 314 may further be configured to display the corresponding sub-circuit for a feature block upon indication by the user. In some instances, it may be possible for a hierarchy to be created in which feature blocks include sub-circuits that in turn also have included feature blocks including their own sub-circuits.

The schematic determination module 314 may be configured to provide a level-of-detail adjustment to allow for a user to adjust the level of detail at while a schematic is drawn. For example, at a higher level of detail, some or all levels sub-circuits may be represented as their individual components, while at a lower level of detail, a greater number or level of sub-circuits may be represented as feature blocks.

The schematic determination module 314 may further be configured to allow for the selective editing of various components or wires of a schematic diagram, and the schematic determination module 314 may visually indicate which components and/or wires in the schematics may be modifiable. For example, components that are modifiable may be illustrated in color, while components that are non-modifiable may be presented in a black-and-white format. As another example, components that are modifiable may be presented accompanied by a particular graphic.

For components that are indicated as being editable, the schematic determination module 314 may allow for the user to substitute another component for the indicated component. Additionally, one or more ends of a wire included in the schematic may be capable of being moved by a user to allow for additional customization of the schematic.

The board layout module 316 may be configured to create a printed circuit board (PCB) layout according to a determined schematic, such as an electrical schematic determined by the schematic determination module 314. The board layout module 316 may determine an appropriate PCB layout according to various parameters, including the topology the circuit, the multiple-load device selected, the size of the selected components, whether the design requires a large amount of copper to dissipate heat or a heat sink to dissipate heat, and the like.

In some examples, the board layout module 316 may be configured to receive an indication of a size of a board on which to layout the components. For instance, the board layout module 316 may provide controls, by way of user interface module 302, to allow for user specification of one or more of PCB width, PCB height, and PCB mounting depth. In other examples, the board layout module 316 may automatically determine where the components are placed on a printed circuit board and delete the portions of the board not used by the components. Thus, the board layout module 316 may be configured to automatically crop the PCB layout based on the components used in the circuit.

In some examples, the board layout module 316 may be configured to determine a PCB layout according to a predetermined landing area approach. In such an approach, a PCB layout of the design is created with a mount for a particular integrated circuit (such as an LM2678 semiconductor) and also with landing pads for various supporting components to be used with the particular IC. The landing pads may be designed to accommodate a variety of combinations of supporting components, which vary in size and shape, by creating the landing pads for the supporting components large enough and spaced closely enough to accommodate different sizes of components that may potentially be used with the IC. Thus, a single PCB board may be used to accommodate many different schematics, having various sizes and varieties of surface mount components.

The electrical simulation module 318 may be configured to allow for an electrical simulation of an electrical schematic, allowing for a user to observe the performance of the circuit under simulated operating conditions. An exemplary electrical simulation module 318 may be the circuit simulation functionality included in the WEBENCH Power Designer provided by National Semiconductor. For example, the electrical simulation module 318 may be utilized to determine an electrical efficiency of a power supply design 125.

The thermal simulation module 320 may be configured to identify heat problems on a PCB early on in the design process and correct the issues before a PCB goes into production. Early diagnosis of a thermal issue may save a time and avoid costly quality accidents. The thermal simulation module 320 may be configured to simulate the thermal behavior of an electronic PCB having various components. The thermal simulation module 320 may use thermal models for components to aid in the analysis. For PCBs that are laid out using a standard PCB layout, the thermal simulation module 320 may further utilize a thermal model for the standard PCB layout.

Based on the PCB and components, the thermal simulation module 320 may utilize a conduction, radiation and convection solver. For instance, the thermal simulation module 320 may utilize the WebTHERM module provided by Flomerics, Inc. to conduct the thermal simulations. The output of the thermal simulation may be illustrated graphically by way of the user interface module 302, such as by a plot of the PCB under the design's steady state electrical load 120 conditions, illustrating an estimate of the generated heat.

The bill of materials module 322 may be configured to determine a bill of materials (BOM) including the list of parts used for each of the power supply designs 125. The bill of materials module 322 may further determine a total cost of the design and a total number of components for the design. For example, the bill of materials module 322 may query the data store 145 for component information 150 related to pricing of the utilized components, and may determine an overall cost of the design based on a total sum of the cost of each utilized component.

The best results determination module 324 may be utilized to determine one or more best results from a set of power supply designs 125. For instance, the best results determination module 324 may determine a ranking of the individual designs in the set of power supply designs 125. The best results determination module 324 may determine the ordering and recommended designs by using a weighted scoring system. As an example, a design requirement 130 may indicate a preference for power supply designs 125 having high efficiency. Accordingly, based on the design requirement 130, the best results determination module 324 may rank the power supply designs 125 according to electrical efficiency for the overall power supply designs 125, where the overall efficiencies may be determined by the electrical simulation module 318.

The best results determination module 324 may determine the ordering while accounting for multiple variables simultaneously. Similar to as discussed above with regard to component selection, the best results ordering may use an algorithm in which a target value is set for one or more parameters of a power supply design 125. The closer a parameter of the power supply design 125 is to the corresponding target, the higher the score for that parameter. A weight may also be assigned to each parameter. Thus, a final score for each power supply design 125 may be determined based on the initial score and the weight (e.g., as a product of the score and weight values). For example, if two parameters with a same deviation from a target value have different weights, the one with the higher weight would receive a higher overall score. This weighted scoring algorithm allows ordering of power supply designs 125 taking into account multiple parameters at once, keeping a balance between important characteristic factors of the component part such as footprint, parasitic resistance, capacitance, and inductance.

The best results determination module 324 may utilize a cutoff to provide up to a maximum number of power supply designs 125. In some instances, a cutoff may indicate a maximum total number of power supply designs 125 to include in the universe of possible solutions. In other instances, a cutoff may indicate a maximum number of power supply designs 125 per power supply architecture.

The best results determination module 324 may indicate the power supply design 125 having the best ranking as being the recommended design. Further, the power supply design 125 out of a set of power supply designs 125 for one particular power supply architecture may be indicated as being the recommended design for that power supply architecture.

The tabular display module 326 may be configured to display a list of the determined power supply designs 125 by way of the user interface module 302. For example, the tabular display module 326 may present a use interface including a table of power supply designs 125 with key parameters displayed, with each row in the table indicating a particular power supply design 125 and associated values and key parameters. Key parameters may include system footprint determined by the board layout module 316, system BOM cost and system component count determined by the bill of materials module 322, system efficiency determined by the electrical simulation module 318, among others.

The values in the table may be arranged according to the ranking determined by the best results determination module 324. For examples, values in the table may be arranged with the best recommendations at the top of a sortable list. As an example, a design requirement 130 may indicate a preference for designs having high efficiency. Accordingly, based on ranking determined by the best results determination module 324, the power supply designs 125 may be displayed in order according to electrical efficiency.

The graphical display module 328 may be configured to provide a graph of the determined power supply designs 125 by way of the user interface module 302. The graphical display module 328 may represent the tradeoffs between the various power supply designs 125 by representing various key parameters as the X and Y axes of the graph. The graphical display module 328 may further represent the points within the graph as items of varying size and/or color to indicate a third key parameter as a third dimension. Thus, the graph can contain more than two dimensions by using circles of different diameters for each data point to signify larger or smaller values and/or different colors to represent differences in the values being plotted.

As an example, the axes may default to system footprint and system efficiency, with a circle around each data point of variable size to represent the BOM cost. The size of the circle may accordingly vary in size to become larger for a higher BOM cost and smaller for a lower BOM cost. The graphical display module 328 may be configured to allow a user to configure the axes of the graph, allowing the user to visualize other parameters in the design such as the $V_{out}$ peak to peak ripple, frequency, BOM count, among others.

The design list filter module 330 may be configured to allow for the filtering of the determined power supply designs 125 displayed by the tabular display module 326 and graphical display module 328. For example, the design list filter module 330 may provide slider controls, check boxes and other controls by way of the user interface module 302 that may be used to specify filter criteria for the displayed power supply designs 125. These controls may allow a user of the user device 105 to narrow down the list of power supply designs 125 according to the specified filter criteria. Because the filtering is performed based on the determined set of power supply designs 125 that form the universe of possible solutions, filtering of the power supply designs 125 may be performed by the user device 105 without requiring any additional database access or interaction with the data store 145.

Exemplary filter criteria may include minimum and maximum efficiency, minimum and maximum footprint, minimum and maximum BOM cost, minimum and maximum BOM count, minimum and maximum ripple, minimum and maximum switching frequency, minimum and maximum crossover frequency, and minimum and maximum phase angle. Further exemplary filter criteria may include additional features that may be present on a utilized power supply component 205 package, such as: on/off pin, error pin, soft start, external synchronization, module, adjustable primary leakage inductance limit, adjustable frequency, synchronized switching, controller, and integrated switch.

The optimization control module 332 may be configured to allow a user to specify system level goals such as small footprint, low cost, or high efficiency. The optimization control module 332 may utilize the user interface module 302 to present a control, such as a knob, to a user device 105, and may receive input from the user from the control. The control may allow the user to select a tradeoff indicating a preference for at least one key parameter over a preference for at least one other key parameter. For example, the control may allow the user to prefer designs with small footprint over designs with high efficiency. Based on the input from the control, the optimization control module 332 may be configured to cause the multiple-load device power design tool application 165 to calculate additional power supply designs 125 containing power supplies optimized according to the new system level goals indicated by the user.

The component acquisition module 334 may be configured to allow a user to purchase the list of parts used in a selected power supply design 125. Using the BOM for a power supply design 125, the component acquisition module 334 may be configured to confirm whether the parts are in stock by querying the component information 150 stored in data store 145. If the parts are determined to be in stock, the component acquisition module 334 may allow the user to purchase a set of parts for building all or a portion of the power supply design 125. The component acquisition module 334 may further be configured to provide assembly instructions for the board that shows the locations of all the components, soldering instructions, an electrical schematic, top-side and bottom-side copper layout diagrams, instructions for building and testing the circuit. In some examples, the component acquisition module 334 may provide an option for the user to receive an assembled version of the power supply design 125.

The architecture navigation module 336 may be configured to allow for navigation of the electrical schematic, such as the schematic determined by the schematic determination module 314. Upon selection of one of the power supply designs 125, such as through use of the tabular display module 326 and the graphical display module 328, the architecture navigation module 336 may be configured to display, by way of the user interface module 302, a user interface 110 including a feature block diagram illustrating the power supply architecture of the selected design. For example, the schematic determination module 314 may determine an electrical schematic where each position in power supply design 125 into which a power supply component 205 and supporting components are included is represented as a feature block.

Further, the architecture navigation module 336 may be configured to receive selections of the feature blocks in the diagram, and display particular attributes for the selected feature block. The architecture navigation module 336 may further be configured to display charts and graphs depicting the relative contribution of each power supply component 205 to the power supply design 125 according to various key parameters, such as power dissipation, BOM cost, footprint, and component count.

The report module 338 may be configured to create a report summarizing the attributes of one or more designs. For example, the report module 338 may be utilized by a user to view a report summarizing the attributes of a selected design from the set of power supply designs 125. The report may include system level attributes such as a feature block diagram, system efficiency, system BOM cost, and system component cost. The report may further include specific information about the input voltage sources 115 including the input voltage range. In addition, the report may include information about each specific power supply from the set of power supply designs 125, including the corresponding schematic, BOM, and associated component information including electrical characteristics such as inductance, DC resistance, current rating, voltage rating, etc. Other information about each power supply may be included as well, such as operating values including duty cycle, efficiency, BOM cost, BOM footprint, currents through components, and power dissipation for components. The operating values may be included in a table or as plots of the operating value vs. other facts such as load 120 current for different voltages. The report may also contain simulation results, such as from the electrical simulation module 318 and/or thermal simulation module 320, which may be represented in numeric form, tabular form such as via tabular display module 326, and/or graphical form such as via graphical display module 328. Reports generated by the report module 338 may be provided in various formats, such as the portable document format (PDF).

The sequencing requirements module 340 may be configured to allow the user to change the order of start up and shut down of the power supplies (i.e., the power supply sequencing.) The sequencing requirements module 340 may further be configured to allow the user to specify a time delay between different power supplies start up and shut down. For example, the sequencing requirements module 340 may provide, by way of the user interface module 302, slider controls for each of the loads 120 of the power supply design 125, allowing the user to set relative start up and shut down times of the supplies for the corresponding loads 120. Given this sequencing information, the sequencing requirements module 340 may be configured to calculate any additional parts, such as ICs, required to support the sequencing behavior. The sequencing requirements module 340 may further indicate for the bill of materials module 322 to add the additional required parts to the BOM for the power supply design 125 and also for the schematic determination module 314 to update the determined schematic and feature block diagram to display the connection of the additionally required parts.

Figure 4:
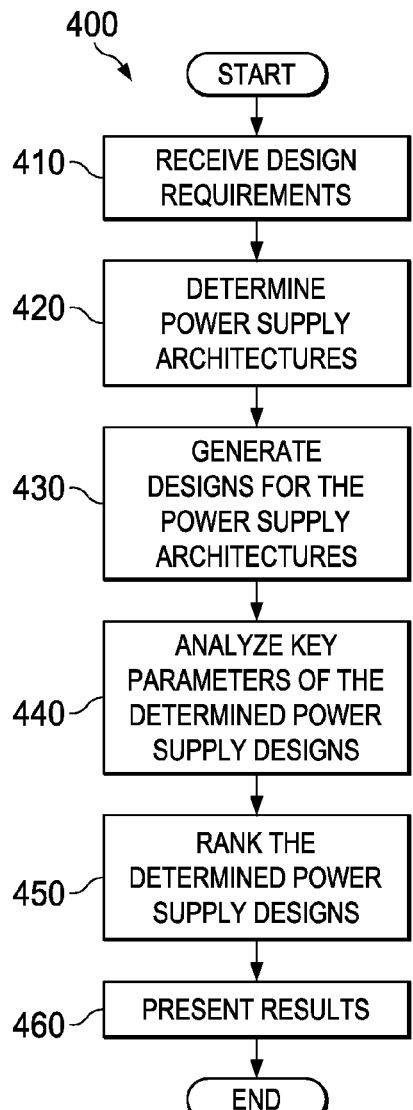
FIG. 4 illustrates an exemplary process flow for determining a power supply for a multiple-load device.

FIG. 4 illustrates an exemplary process flow 400 for determining a power supply design 125 for a multiple-load device. The process 400 may be performed by various systems, such as the by the system 100 described above with respect to FIG. 1.

In block 410, a multiple-load device power design tool application 165 receives design requirements 130 from a user device 105. For example, a communications network 135 may be in selective communication with a user device 105 and an application site 140. The application site 140 may serve as a hosting platform for an application server 160 running the multiple-load device power design tool application 165. A user interface module 302 and a requirements module 304 of the multiple-load device power design tool application 165 may be configured to provide a user interface 110 to a user device 105, such as a web page, where the user interface 110 may allow the user of the user device 105 to specify the design requirements 130 for a power supply design 125. The design requirements 130 may include information regarding a set of two or more loads 120 to be powered by a one or more input voltage sources 115. To allow for quick and accurate specification of the design requirements 130, the requirements module 304 may utilize a preconfigured listing of multiple-load devices (including but not limited to FPGAs and/or microprocessors), and their associated loads 120 including voltage and current requirements, such as the multiple-load device power requirements 155 stored in data store 145.

In block 420, the multiple-load device power design tool application 165 determines power supply architectures that may be used to satisfy the received design requirements 130. For example, based on the loads 120 and input voltage sources 115 specified by the design requirements 130, the multiple-load device power design tool application 165 may utilize an architecture determination module 306 to determine a variety of different power supply architectures that may be appropriate to power the loads 120. The architecture determination module 306 may selectively group the loads 120 onto common supplies, as well as arrange power supplies between the input voltage source 115 and the various loads 120. Based on the groupings and arrangements, the architecture determination module 306 may define one or more positions into which power supply components 205 are to be included, as well as defining load requirements for each of the positions. The architecture determination module 306 may accordingly determine a plurality of potential power supply architectures according to different combinations of input voltage sources 115 and intermediate rail voltages 210 with the loads 120 specified by the received design requirements 130.

In block 430, the multiple-load device power design tool application 165 generates power supply designs 125 for the determined power supply architectures. For example, the multiple-load device power design tool application 165 may utilize a component determination module 308, a circuit design module 310, and a circuit optimization module 312 to determine one or more power supply components 205 and supporting components that could be used to build circuits for a given power architecture, optimized according to the design goals indicated in the design requirements 130.

In block 440, the multiple-load device power design tool application 165 performs analysis of key parameters of the determined power supply designs 125. For example, the multiple-load power design tool application 165 may utilize a schematic determination module 314 to produce an electrical schematic diagram, and a board layout module 316 to create a PCB layout according to the determined schematic. Then the multiple-load device power design tool application 165 may utilize an electrical simulation module 318 to determine an electrical efficiency of an electrical schematic, and a thermal simulation module 320 to simulate the thermal behavior of the PCB layout. The multiple-load device power design tool application 165 may also utilize a bill of materials module 322 to determine a BOM including the list of parts used and the total part count for each of the power supply designs 125.

In block 450, the multiple-load device power design tool application 165 ranks the determined power supply designs 125 based on the design goals indicated in the design requirements 130. For example, the multiple-load device power design tool application 165 may utilize a best results determination module 324 to determine one or more best results from a set of power supply designs 125. The best results determination module 324 may determine a ranking of the individual designs in the set of power supply designs 125. The best results determination module 324 may further determine an overall best design, and/or one or more recommended designs. Additionally, for each of the determined power supply architectures, the best results determination module 324 may determine the best design out of the power supply designs 125 for each power supply architecture.

In block 460, the multiple-load device power design tool application 165 presents the power supply designs 125 to the user. For example, the multiple-load device power design tool application 165 may send the power supply designs to the user device 105 that form the universe of possible solutions for the design requirements 130. The user device 105 may utilize a tabular display module 326 to display a table of the power supply designs 125 and key parameters, with each row in the table indicating a particular power supply design 125 and associated values. The multiple-load power design tool application 165 may also utilize a graphical display module 328 to provide a graph of the determined power supply designs 125 representing tradeoffs between the various power supply designs 125 according to key parameters. In some examples, the multiple-load device power design tool application 165 presents only the best power supply design 125 for each determined power supply architecture. The multiple-load device power design tool application 165 may further indicate which power supply design 125 out of the presented power supply designs 125 is determined to be the best design. Because the universe of possible power supply designs 125 has already been computed by the multiple-load device power design tool application 165, the user device 105 may perform filtering of the determined power supply designs 125 displayed by the tabular display module 326 and graphical display module 328 without additional access or interaction with the data store 145. After block 460, the process 400 ends.

Figure 5:
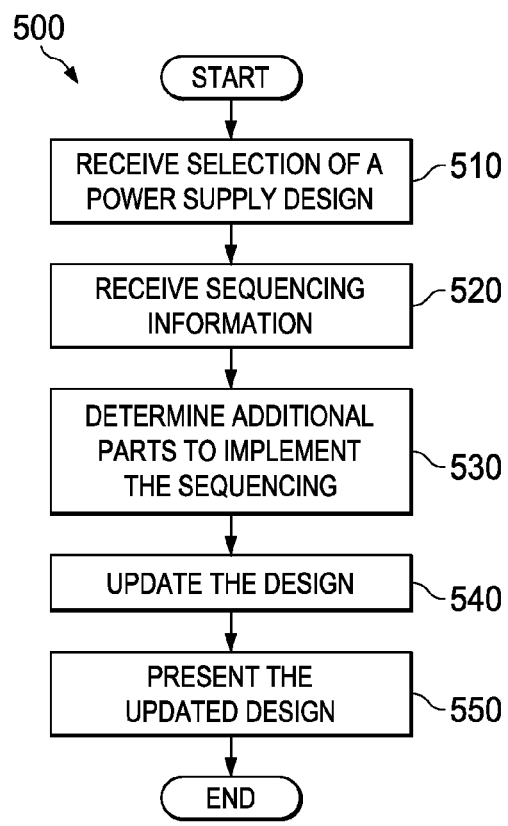
FIG. 5 illustrates an exemplary process flow for the inclusion of sequencing constraints into a power supply design for a multiple-load device.

FIG. 5 illustrates an exemplary process flow 500 for the inclusion of sequencing constraints into a power supply design 125 for a multiple-load device. The process 500 may be performed by various systems, such as by the system 100 described above with respect to FIG. 1.

In block 510, the multiple-load device power design tool application 165 receives a selection of a power supply design 125. For example, the multiple-load device power design tool application 165 may utilize a tabular display module 326 to display a table of generated power supply designs 125, and may utilize a graphical display module 328 to display a graphical representation of the power supply designs 125. The multiple-load device power design tool application 165 may receive a selection of one of the power supply design 125 through a user selection of a power supply design 125 selected from the table of power supply designs 125 or from the graphical representation of the power supply designs 125.

In block 520, the multiple-load device power design tool application 165 receives sequencing information regarding the power supply loads 120. For example, the multiple-load power design tool application 165 may utilize a sequencing requirements module 340 to allow the user to add or modify the order of start up and shut down of at least a subset of the power supplies. The sequencing requirements module 340 may further be configured to allow the user to specify a time delay between different power supplies start up and shut down. For example, the sequencing requirements module 340 may provide slider controls for each of the loads 120 of the selected power supply design 125, allowing the user to set relative start up and shut down times of the supplies for the corresponding loads 120.

In block 530, the multiple-load device power design tool application 165 determines additional parts to add to the power supply design 125 to implement the power supply sequencing. For example, given the received sequencing information, the sequencing requirements module 340 calculate any additional parts, such as ICs, required to support the required sequencing behavior.

In block 540, the multiple-load device power design tool application 165 updates the power supply design 125 according to the determined updates to support the sequencing requirements. For example, the sequencing requirements module 340 or the multiple-load device power design tool application 165 may further indicate for a schematic determination module 314 of the multiple-load device power design tool application 165 to update the schematic to display the connection of the additionally required parts to support the sequencing requirements. The sequencing requirements module 340 or the multiple-load device power design tool application 165 may further indicate for the key parameters for the power supply design 125 to be updated. For example, the multiple-load device power design tool application 165 may indicate for a board layout module 316 to determine an updated board layout, for an electrical simulation module 318 to determine an updated efficiency based on the updated schematic, for a thermal simulation module 320 to determine updated thermal information for updated board layout, and for a bill of materials module 322 of the multiple-load device power design tool application 165 to add the additional required parts to the BOM for the power supply design 125.

In block 550, the multiple-load device power design tool application 165 presents the updated power supply design 125 to the user device 105. For example, the multiple-load device power design tool application 165 may display the updated schematic and updated key parameters to the user by way of the user interface module 302. After block 550, the process 500 ends.

Figure 6:
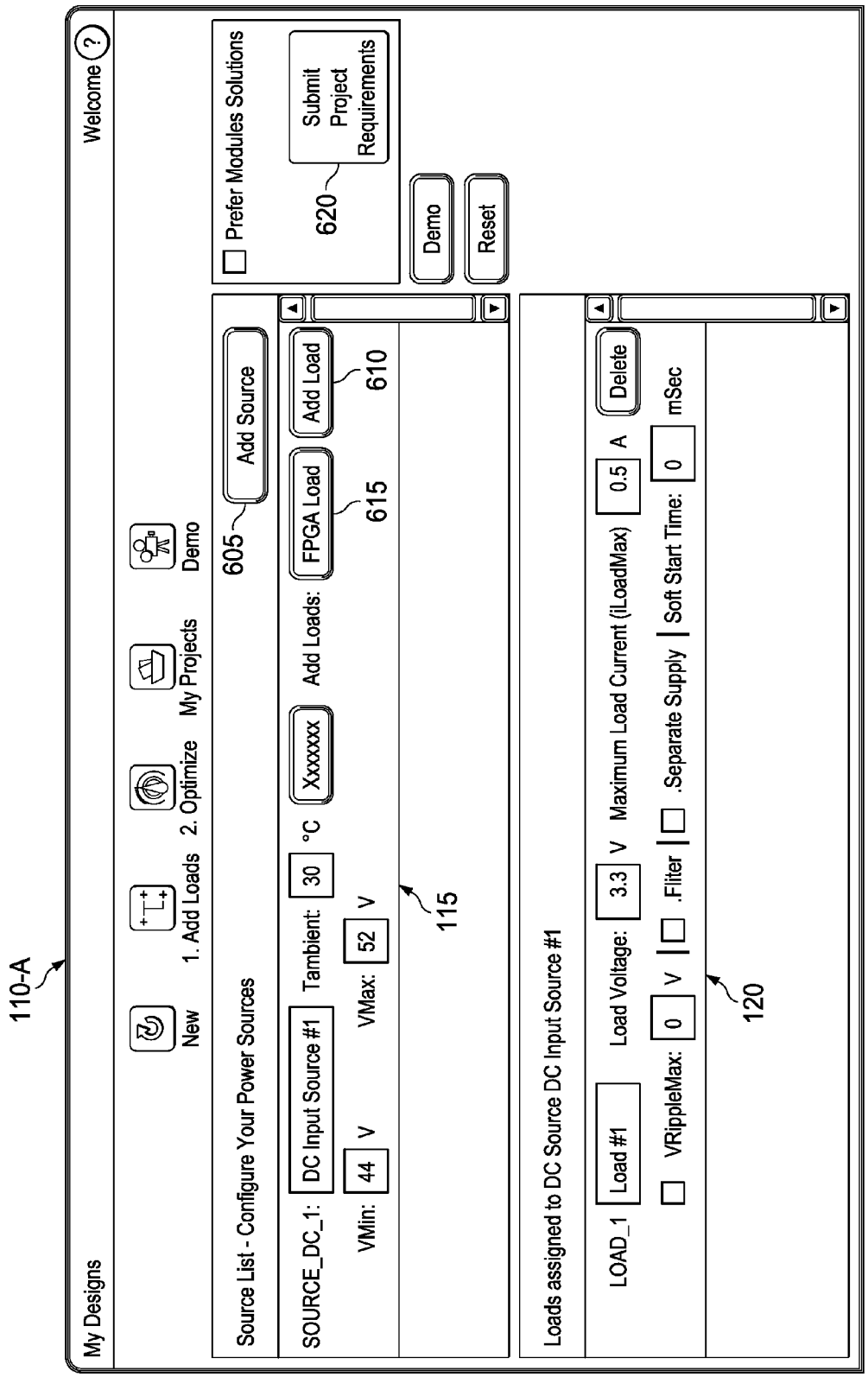
FIG. 6 illustrates an exemplary user interface for the input of design requirements.

FIG. 6 illustrates an exemplary user interface 110-A for the input of design requirements 130. For example, the user interface 110-A may be generated by a user interface module 302 of a multiple-load device power design tool application 165, and may allow for a user of a user device 105 to input design requirements 130. As shown, the user interface 110-A may provide for the input of one or more input voltage sources 115, and a plurality of loads 120 assigned to the corresponding input voltage sources 115.

The user may utilize an add source control 605 to add an input voltage source 115 to the design requirements 130. Each input voltage source 115 added to the design requirements 130 may allow for the specification of a name, an ambient temperature, a minimum voltage, and a maximum voltage.

The user may further utilize an add load control 610 to add an additional load 120 to the design requirement 130. Each load 120 added to the design requirements 130 may allow for the specification of a name, a voltage for the load 120, a maximum current for the load 120, an optional percentage maximum for voltage ripple, optional filtration, an indication that a particular load 120 requires a separate supply for use in grouping the loads 120, and a number of milliseconds of soft start time. Additionally as shown in FIGS. 7-9, the user may utilize the FPGA load control 615 to select loads 120 of a preconfigured FPGA to add to the design requirements 130.

Once the user has completed specification of the design requirements 130, the user may select the submit project requirements control 620. Upon selection of the submit project requirements control 620, the multiple-load device power design tool application 165 may determine a set of generated power supply designs 125 according to the design requirements 130.

Figure 7A:
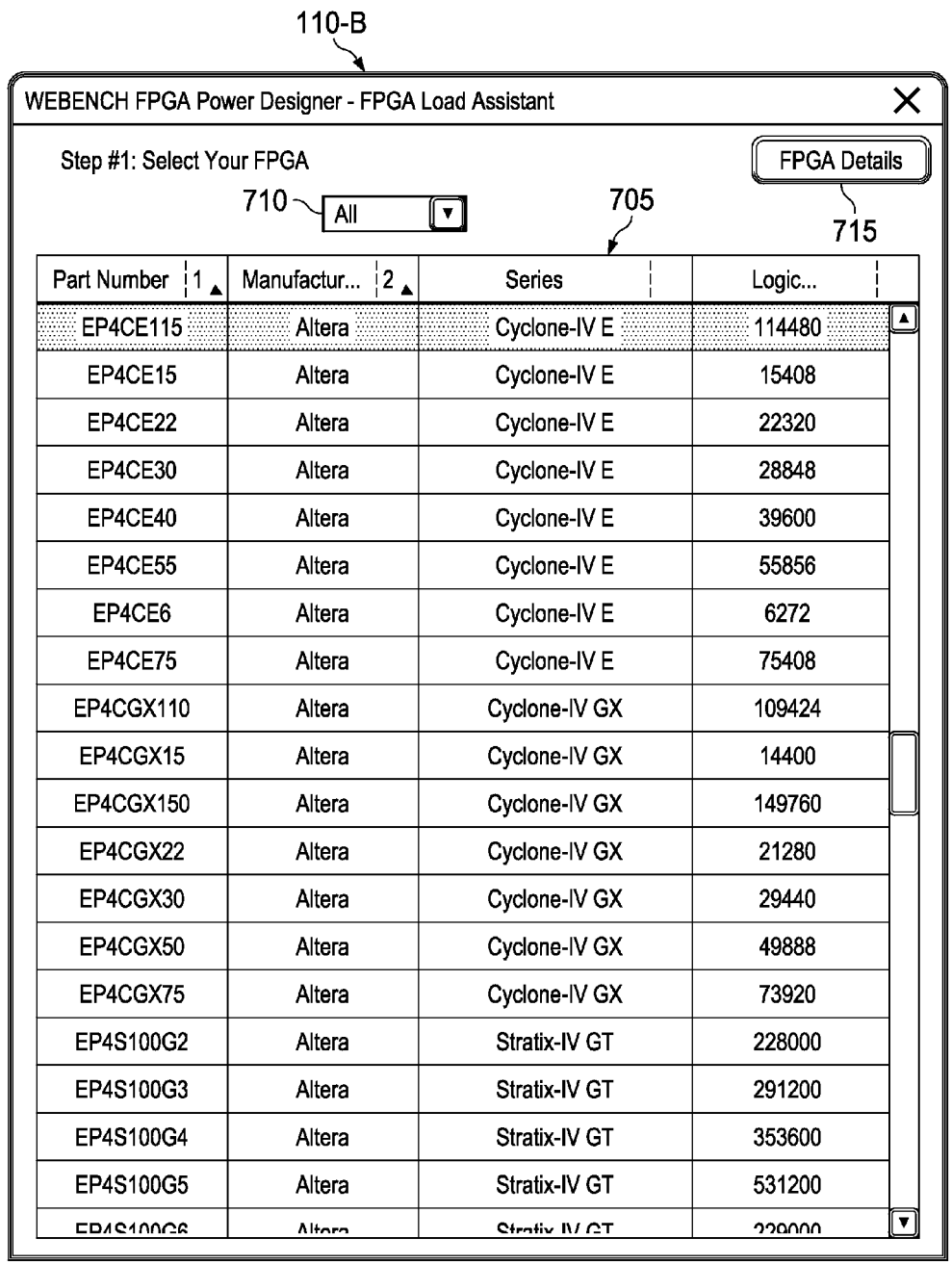
FIG. 7A illustrates an exemplary user interface for the selection of a multiple-load device.

FIG. 7A illustrates an exemplary user interface 110-B for the selection of a multiple-load device. As shown, the user interface 110-B may include a tabular listing of FPGAs 705, including information regarding the FPGAs such as part number, manufacturer, the series of the part, and the number of logic elements included in the FPGA. The user interface 110-B may further includes a dropdown filter 710 configured to allow the user to filter the tabular listing of multiple-load devices 705 (in this instance FPGAs), such as filtering by part manufacturer. The user interface 110-B may further include a details button 715 configured to show further details of a selected FPGA. Accordingly, the user may select one or more of the FPGAs included in the tabular listing 705, and may select the FPGA details button 715 to view details of the FPGA.

Figure 7B:
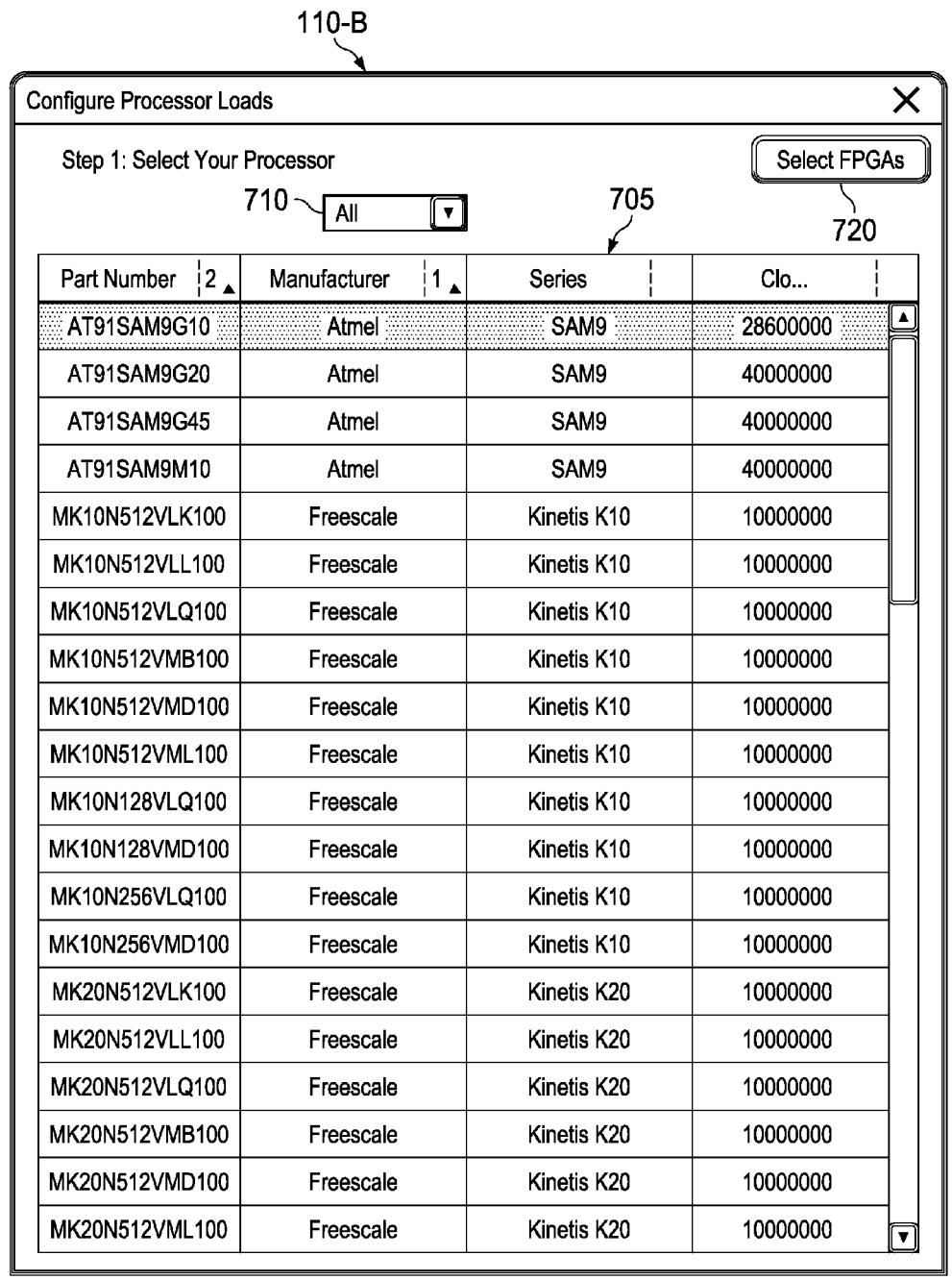
FIG. 7B illustrates an alternate exemplary user interface for the selection of a multiple-load device.

FIG. 7B illustrates an alternate exemplary user interface 110-B for the selection of a multiple-load device. Similar to as shown in FIG. 7A, the user interface 110-B may include a listing of microprocessors, associated information regarding the processors, and a dropdown filter 710 to allow the user to filter the listing. The user interface 110-B may further include a control 720 configured to allow the user to switch between different types of multiple-load devices, such as between a listing of FPGAs and a listing of microprocessors. In other instances, the user interface 110-B may include a listing of multiple types of multiple-load device in the same list, such as both FPGAs and also microprocessors in a single list.

Figure 8A:
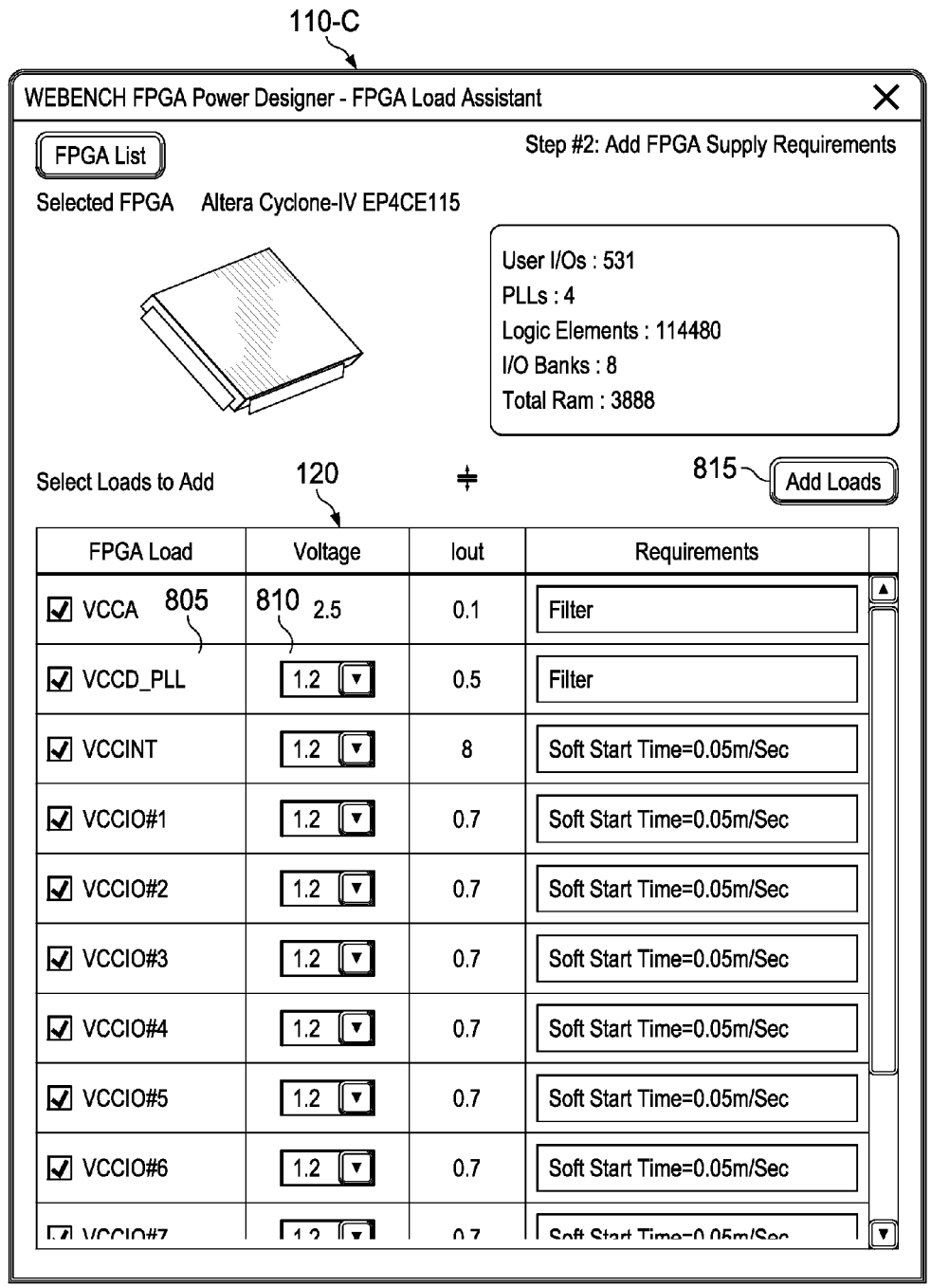
FIG. 8A illustrates an exemplary user interface for the selective inclusion of loads for a selected multiple-load device.
Figures 8B, 9, 9A, 9B:
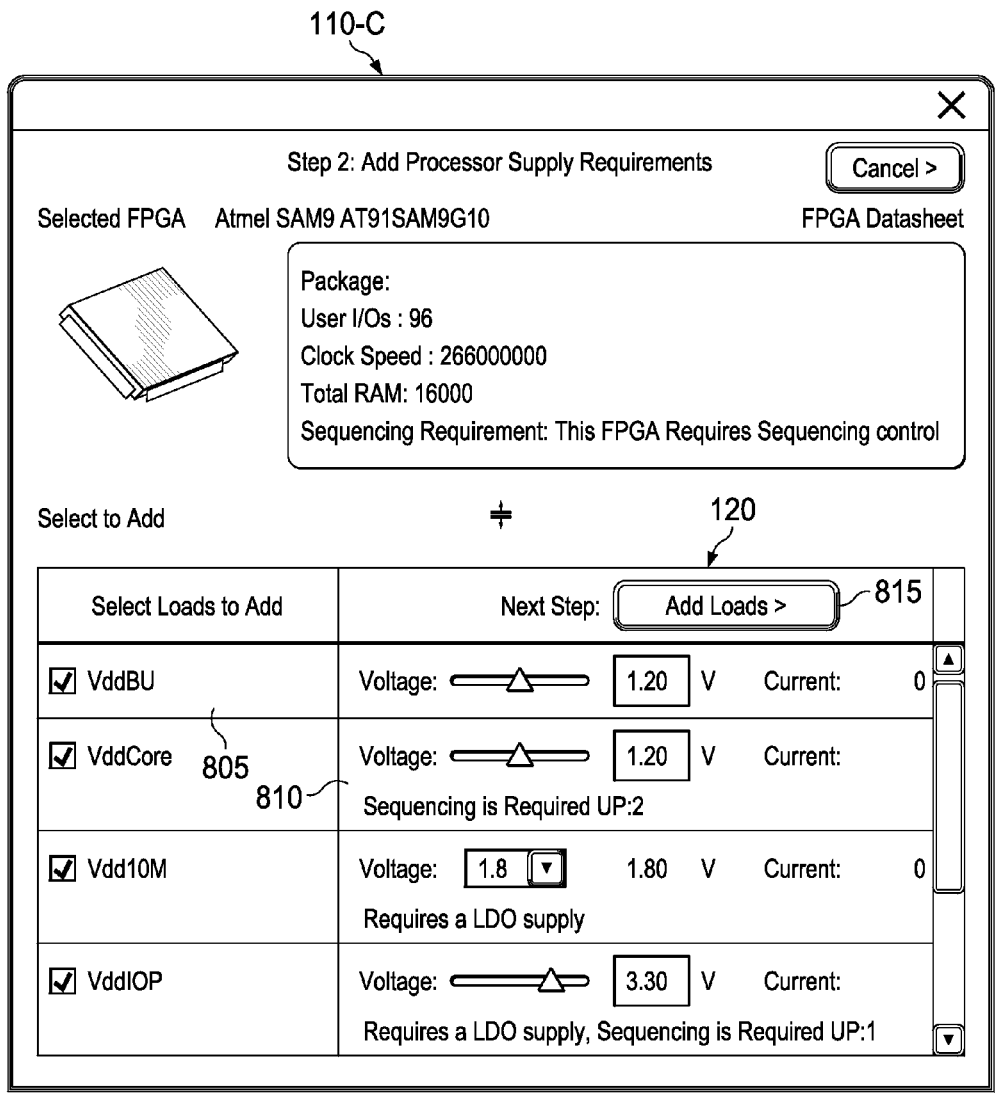
FIG. 8B illustrates an alternate exemplary user interface for the selective inclusion of loads for a selected multiple-load device.
FIG. 9 illustrates an exemplary user interface showing the inclusion of loads based on selection of a multiple-load device.
Figure 9A:
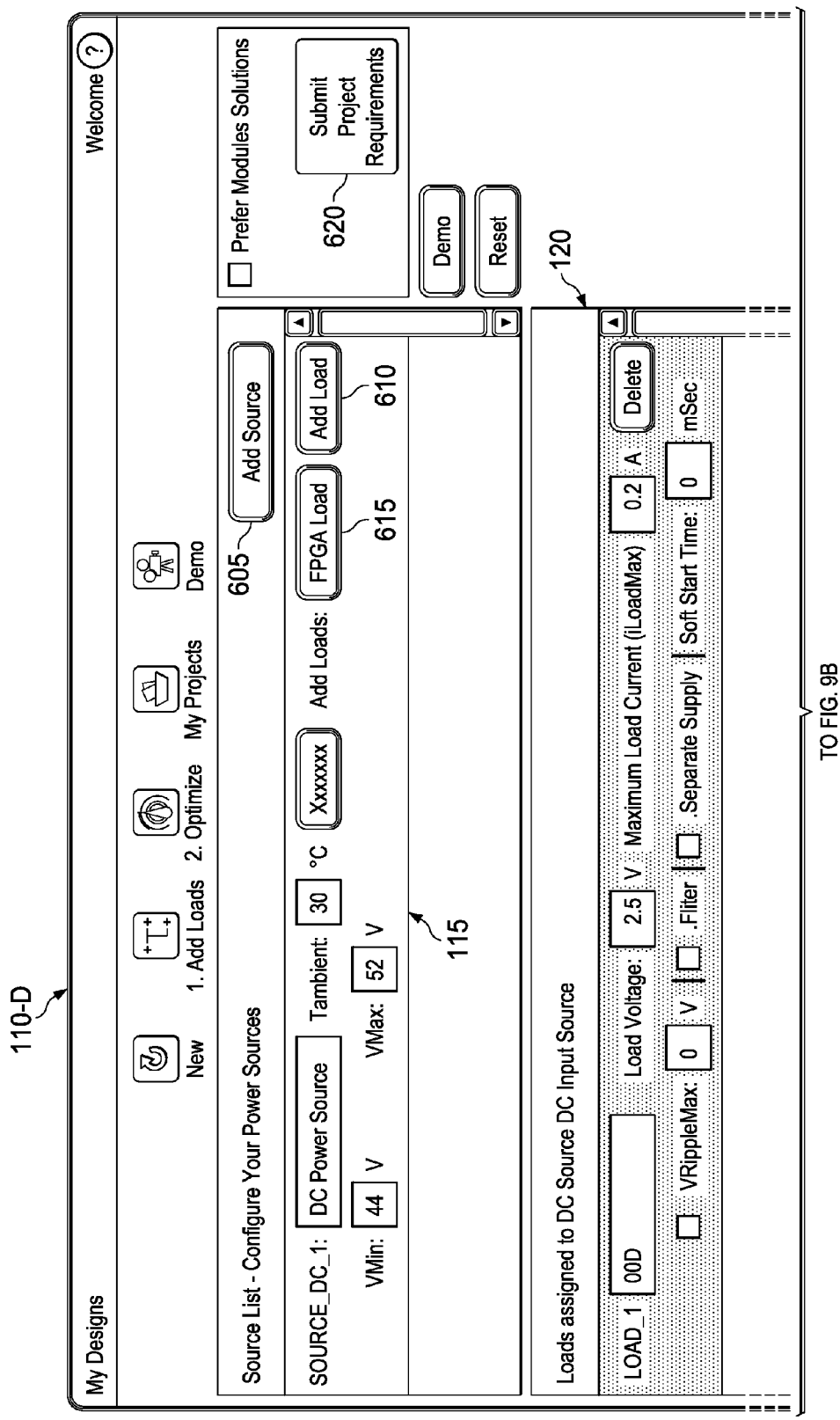

FIG. 8A illustrates an exemplary user interface 110-C for the selective inclusion of loads 120 for a selected multiple-load device. The user interface 110-C may be displayed after selection of the FPGA details button 615 of FIG. 7A, and may include details of the FPGA selected from the tabular listing of FPGAs 705 from FIG. 7A.

The user interface 110-C may further include checkboxes 805 to allow for the selective inclusion of one or more pre-specified loads 120 associated with the selected FPGA. The user interface 110-C may further allow for configuration of the voltage and other requirements for each load 120 based on preconfigured available choices. For example, preconfigured voltages for certain loads 120 may be provided in a dropdown control 810, allowing for configuration of the particular voltage from allowable choices. Upon selection of an add loads control 815, the set of selected FPGA loads 120 may be added to the design requirement 130.

FIG. 8B illustrates an alternate exemplary user interface 110-C for the selective inclusion of loads 120 for a selected multiple-load device. Similar to as discussed above with respect to FPGA multiple-load devices, the user interface 110-C may be displayed after selection of the FPGA details button 615 of FIG. 7A, and may include details of a microprocessor or some other multiple-load devices selected from a tabular listing of multiple-load devices. In the alternative, the user interface 110-C may be displayed accompanied by the user interface 110-B such as the one illustrated in FIG. 7B. In examples where the user interface 110-B and user interface 110-C are simultaneously displayed, the user interface 110-C may be updated in accordance to any selection of a multiple-load device made in the interface 110-B.

FIG. 9 illustrates an exemplary user interface 110-D for the input of design requirements 130, illustrating the inclusion of selected loads 120 based on selection of a preconfigured multiple-load device. As shown in user interface 110-D, the set of selected loads 120 from user interface 110-C are added to the design requirements 130. If additional loads 120 or input voltage sources 115 are required, then the user interface 110-D may allow for their inclusion as discussed about with respect to user interface 110-B in FIG. 7. Once the user has completed specification of the design requirements 130, the user may select the submit project requirements control 620.

Figure 10:
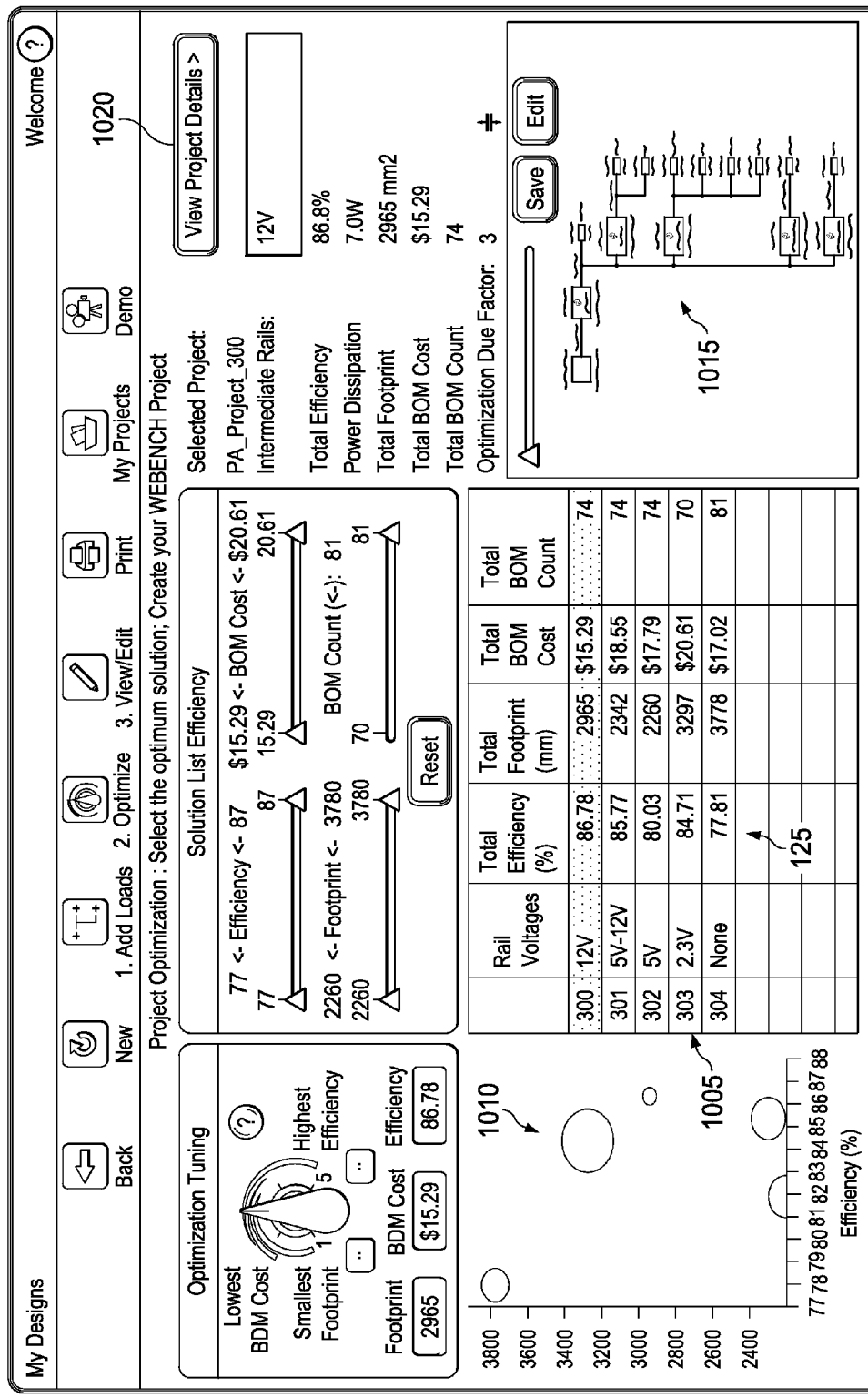
FIG. 10 illustrates an exemplary user interface illustrating a set of generated power supply designs configured to power a multiple-load device.

FIG. 10 illustrates an exemplary user interface 110-E illustrating a set of generated power supply designs 125. As shown in the user interface 110-E, five power supply designs 125 are included in a tabular list 1005 and a graphical display 1010 of the power supply designs 125. The tabular list 1005 may be created by a tabular display module 326 of the multiple-load device power design tool application 165, and the graphical display 1010 may be created by a graphical display module 328 of the multiple-load device power design tool application 165.

Notably, rather than displaying fifty or more power supply designs 125 for each of the determined power supply architectures, the tabular list 1005 instead may display a best design for each of the different determined power supply architectures. For example, the exemplary tabular list 1005 as shown includes a best design for power supply architectures having a 12V intermediate rail voltage 210, a best design for power supply architectures having both 5V and 12V intermediate rail voltages 210, a best design for power supply architectures having a 5V intermediate rail voltage 210, a best design for power supply architectures having a 23V intermediate rail voltage 210, and a best design for power supply architectures having no intermediate rail voltages 210. The tabular list 1005 may further include values for key parameters of the power supply designs 125 such as efficiency, footprint, BOM cost, and BOM count.

These details of the power supply designs 125 may further be displayed graphically in the graphical display 1010. For example, in the graphical display 1010 the X-axis may represent system efficiency, and the Y-axis may represent system footprint. The circle size in the graphical display 1010 may indicate system BOM cost, where a larger circle represents a larger cost, and a smaller circle represents a smaller cost. The axis and the circles may be reconfigured to display different key parameters as well. For example, any of the X-axis, the Y-axis, and the circle size may be reconfigured to represent any of total efficiency, power dissipation, total footprint, total bill of materials cost, total component count, among others key parameters.

Further details of a selected one of the power supply designs 125 may also be illustrated in the user interface 110-E, including a schematic diagram 1015 of the selected power supply design 125 that may be created by a schematic determination module 314, as well as other key parameters of the selected power supply design 125, such as the intermediate rail voltages 210, total efficiency, power dissipation, total footprint, total bill of materials cost, total component count, and an optimization factor relating to the optimizations used to determine the selected power supply design 125.

Figure 11:
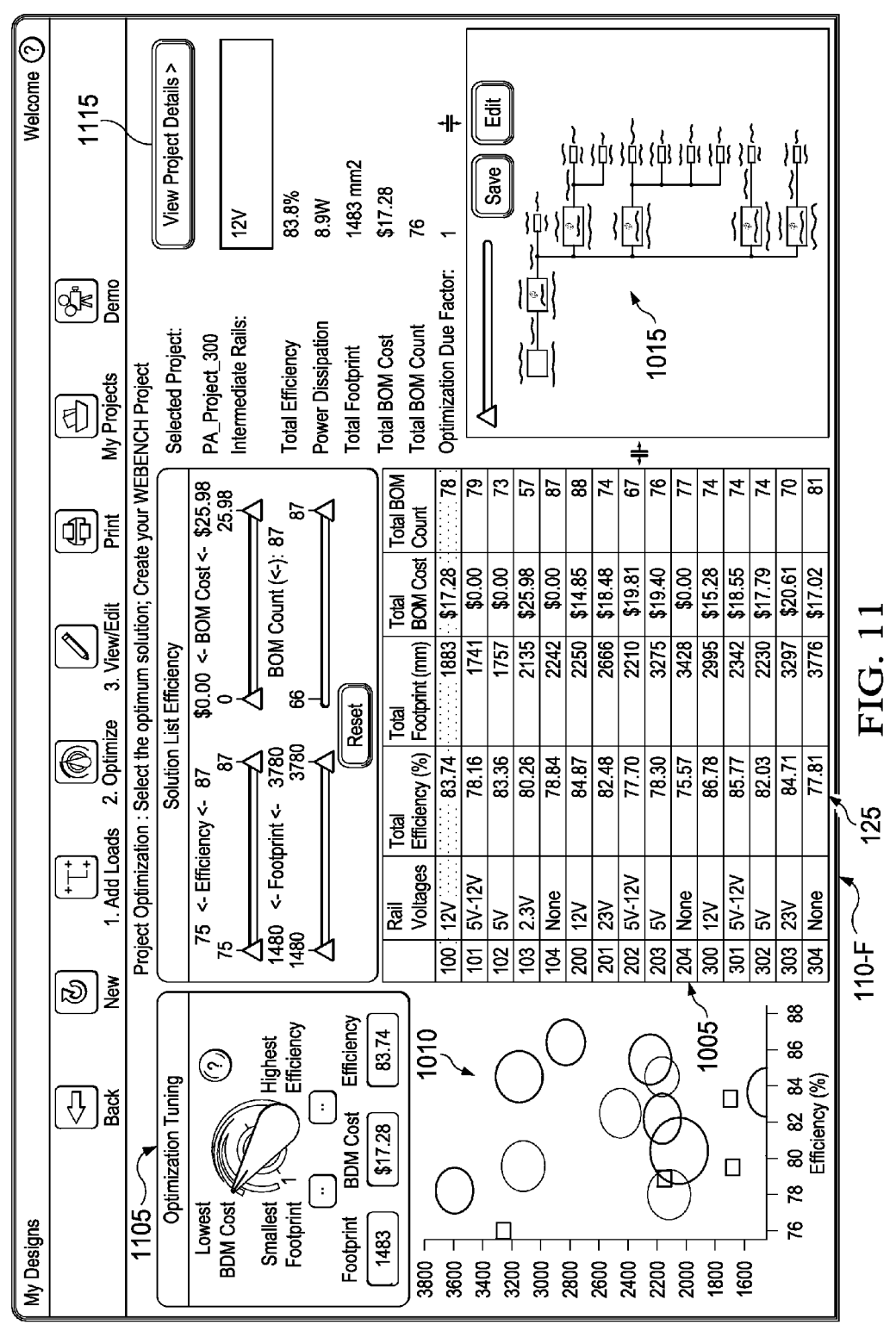

FIG. 11 illustrates an exemplary user interface 110-F illustrating additional generated power supply designs 125. These additional power supply designs 125 may be added by submitting additional design requirements 130 configured to optimize the power supply designs 125 for different values of key parameters. For example, additional power supply designs 125 may be generated upon selection of a different optimization setting from an optimization tuning dial 1105 provided by an optimization control module 332 of the multiple-load device power design tool application 165. As shown in user interface 110-F, the additional power supply designs 125 may be added to the tabular list 1005 and graphical display 1010. Notably, the existing recommended designs optimized for previous design requirements 130 are retained in the displayed power supply designs 125. This allows for the comparison of the best power supply designs 125 optimized according to different optimization settings.

The user interface 110-F may allow for the filtering of the set of power supply designs 125 illustrated in the tabular list 1005 and graphical display 1010 by way of filtering controls 1110. The filtering may be performed by a design list filter module 330 of the multiple-load device power design tool application 165, and may allow for filtering of the power supply designs 125 by the user device 105 according to parameters such as minimum and maximum efficiency, minimum and maximum footprint, minimum and maximum BOM cost, and minimum and maximum BOM count. Because the filtering is performed based on the determined set of power supply designs 125 that form the universe of possible solutions, filtering of the power supply designs 125 may be performed by the user device 105 without requiring any additional database access or interaction with the data store 145.

Figure 12:
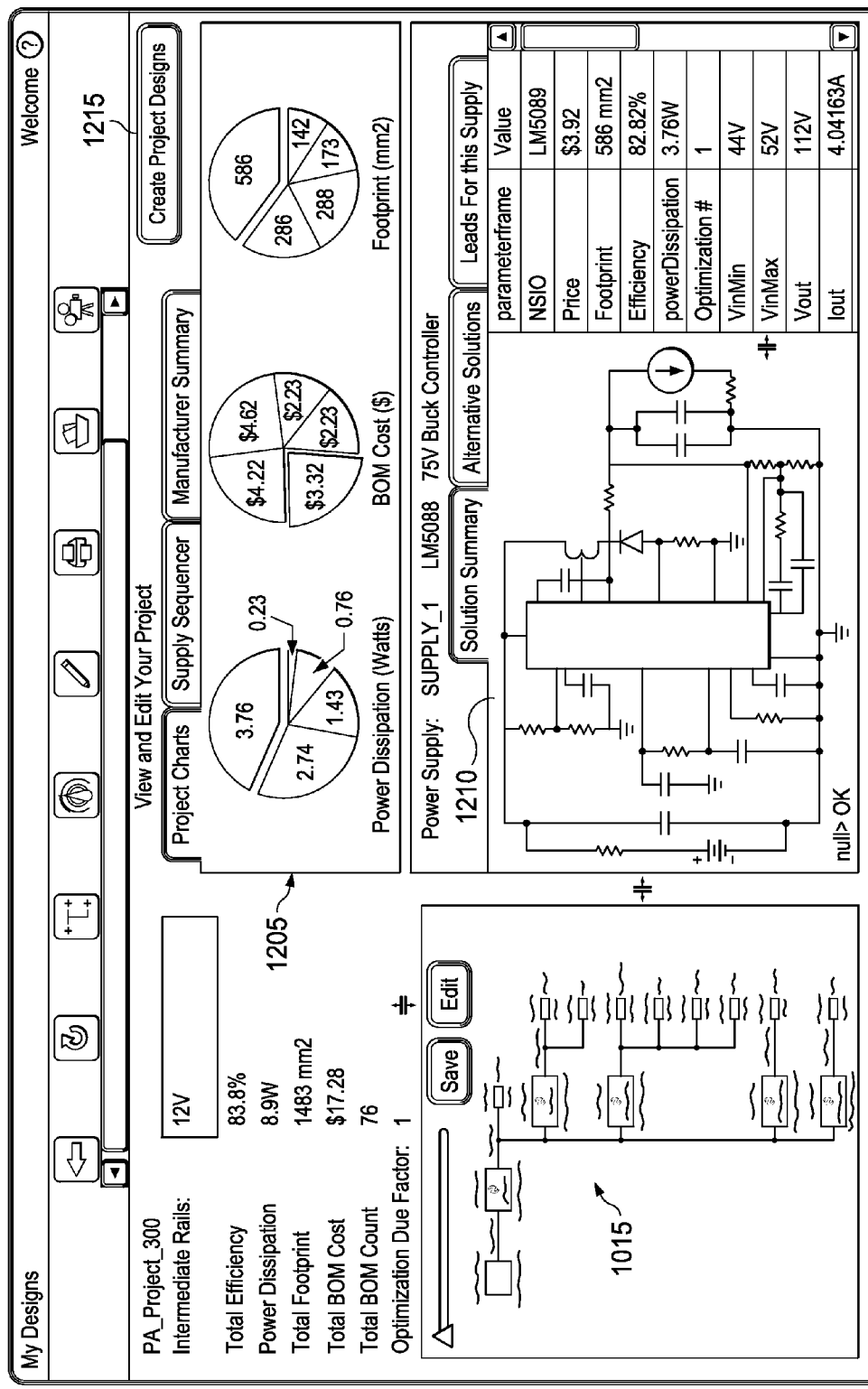
FIG. 12 illustrates an exemplary user interface illustrating exemplary project details for one of the power supply designs, including project charts related to key parameters of the one power supply design.

Further details of a selected power supply design 125 may be illustrated upon selection of a project details control 1115 of the user interface 110-F. FIG. 12 illustrates an exemplary user interface 110-G illustrating such further details for one of the power supply designs 125, including project charts 1205 related to key parameters of the one power supply design 125.

As shown in user interface 110-G, the multiple-load device power design tool application 165 may allow for visualization of the relative contributions of component supplies to the total values of various key parameters. For example, the user interface 110-G may illustrate a schematic diagram 915 of the selected power supply design 125, where each functional block of the schematic is indicated in a different color.

The user interface 110-G may further include project charts 1205 determined by the architecture navigation module 336 that graphically represent the relative contribution of each feature block to the whole power supply design 125. For example, the project charts 1205 may represent the relative contributions of each feature block according to key parameters, such as power dissipation, BOM cost, and footprint. Through use of the project charts 1205, a user may determine the relative contributions of each power supply design 125 according to the key parameters.

The user may further determine whether one of the supplies in the power supply design 125 is making too large of a contribution and may take corrective action. For example, if one power supply component 205 is responsible for most of the footprint, the user may select another power supply component 205 with a smaller footprint, if one is available. For example, the alternate solutions tab 1210 may allow the user to choose another power supply component 205.

Upon selection of a create project details control 1215, the power supply design 125 may be input into a circuit design tool for further analysis, such as the WEBENCH Power Designer provided by National Semiconductor.

Figure 13:
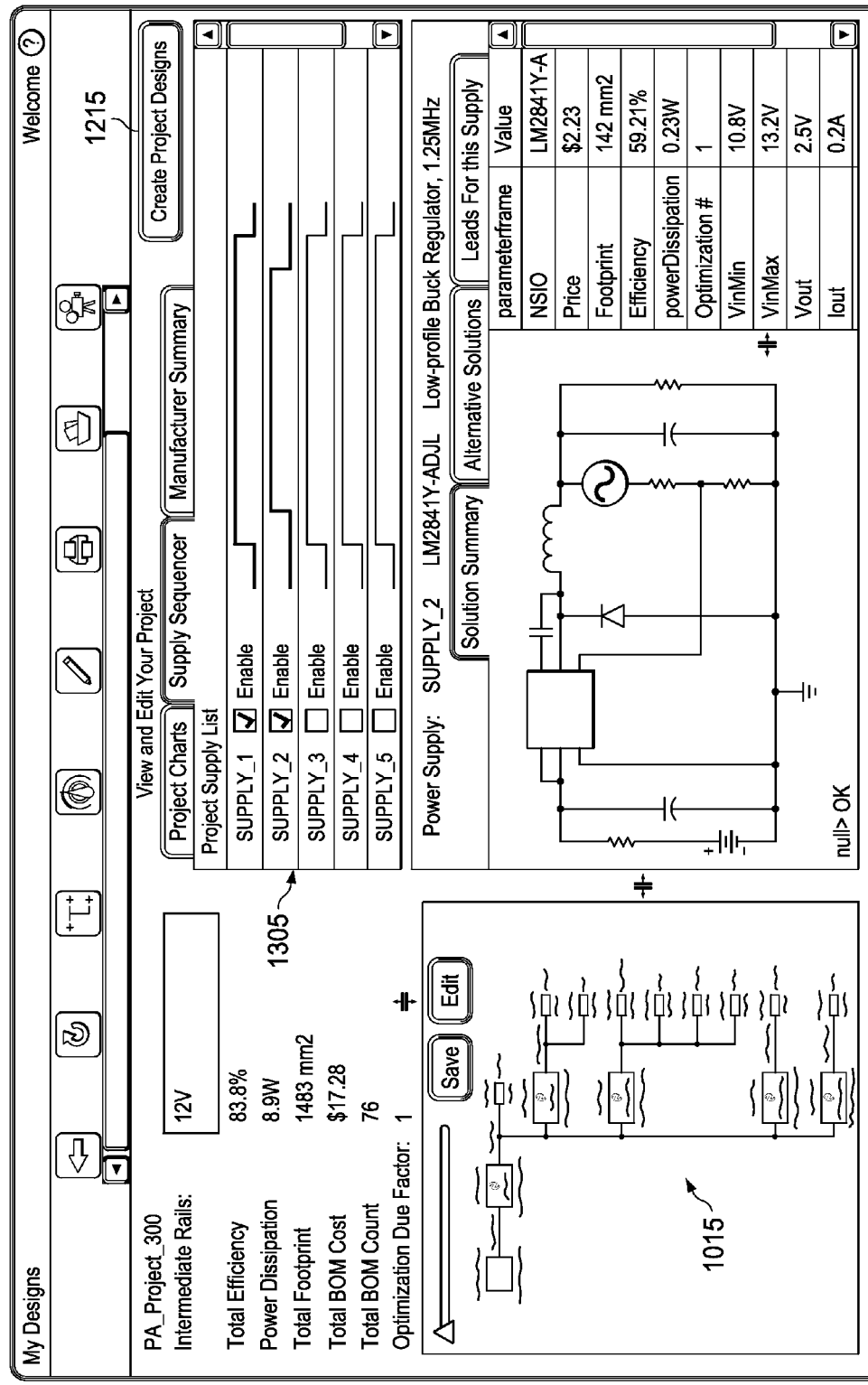
FIG. 13 illustrates an exemplary user interface illustrating exemplary project details for one of the power supply designs, including a supply sequencer configured to specify sequencing information for the loads.

FIG. 13 illustrates an exemplary user interface 110-H illustrating exemplary project details for one of the power supply designs 125, including a supply sequencer configured to specify sequencing information for the loads 120. As with user interface 110-G, the user interface 110-H may illustrate a schematic diagram 1015 of the selected power supply design 125, where each functional block of the schematic is indicated in a different shade or color. The user interface 110-H may further include sequencing information controls 1305 generated by sequencing requirements module 340. The sequencing information controls 1305 may be configured to allow a user to set a sequencing of the start up and shut down of the power supplies to the loads 120.

As shown in user interface 110-H, the checkboxes for supplies 1 and 2 are selected for input of sequencing information. Further, supply 2 has been configured to start up in sequence after supply 1 and to shut down in sequence before supply 1. Based on this sequencing information, the sequencing requirements module 340 may determine any additional components to the power supply design 125 that may be required to implement the additional sequencing functionality.

Figure 14:
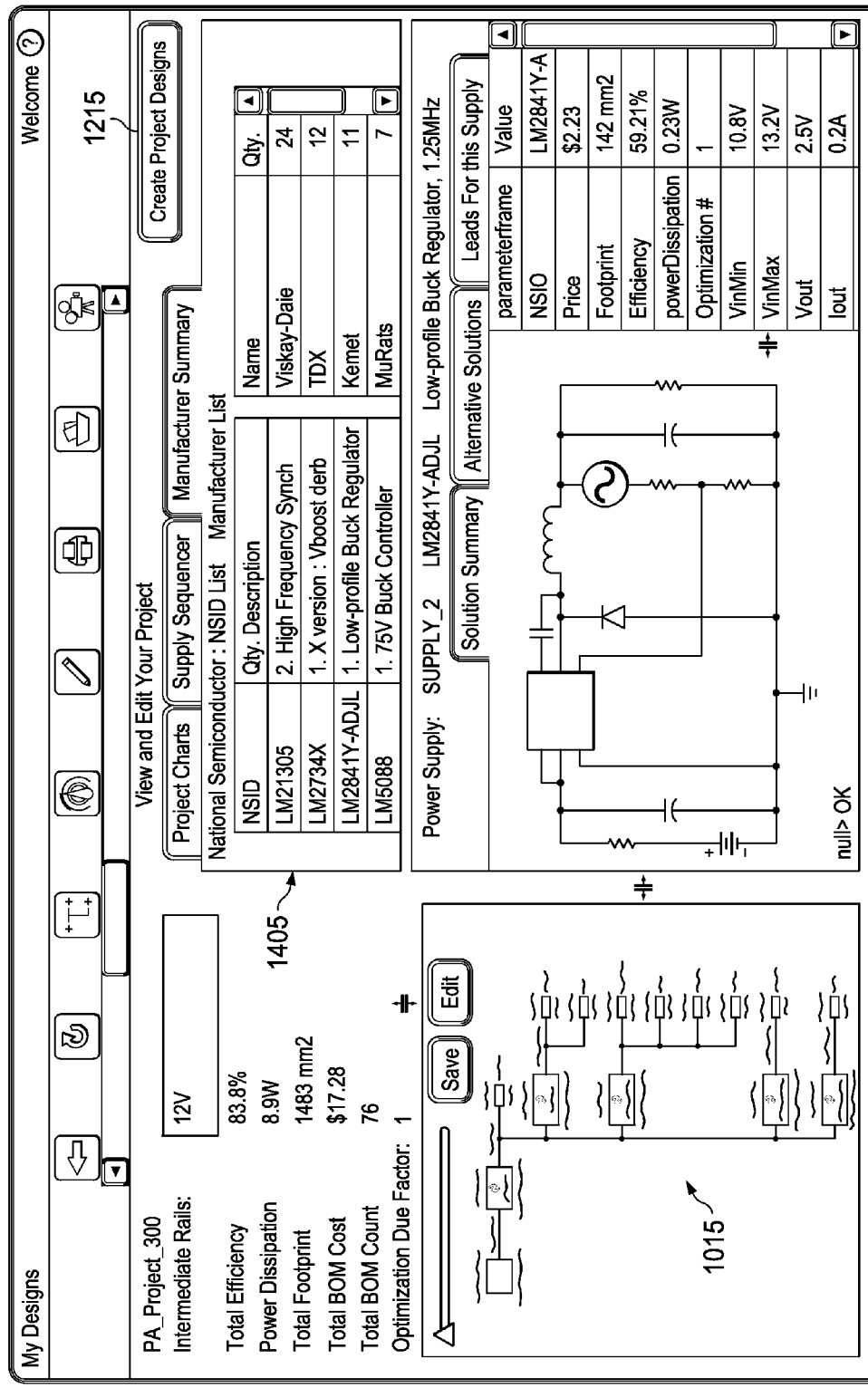
FIG. 14 illustrates an exemplary user interface illustrating an exemplary manufacturer summary of the parts utilized for one of the power supply designs.

FIG. 14 illustrates an exemplary user interface 110-I illustrating a manufacturer summary of the parts utilized for one of the power supply designs 125. As shown in the user interface 110-I, a manufacturer summary control 1405 may include a listing of the power supply components 205 of the selected power supply design 125 by identifier, quantity, and description, as well as by manufacturer name and quantity from the corresponding manufacturer.

Figure 15A:
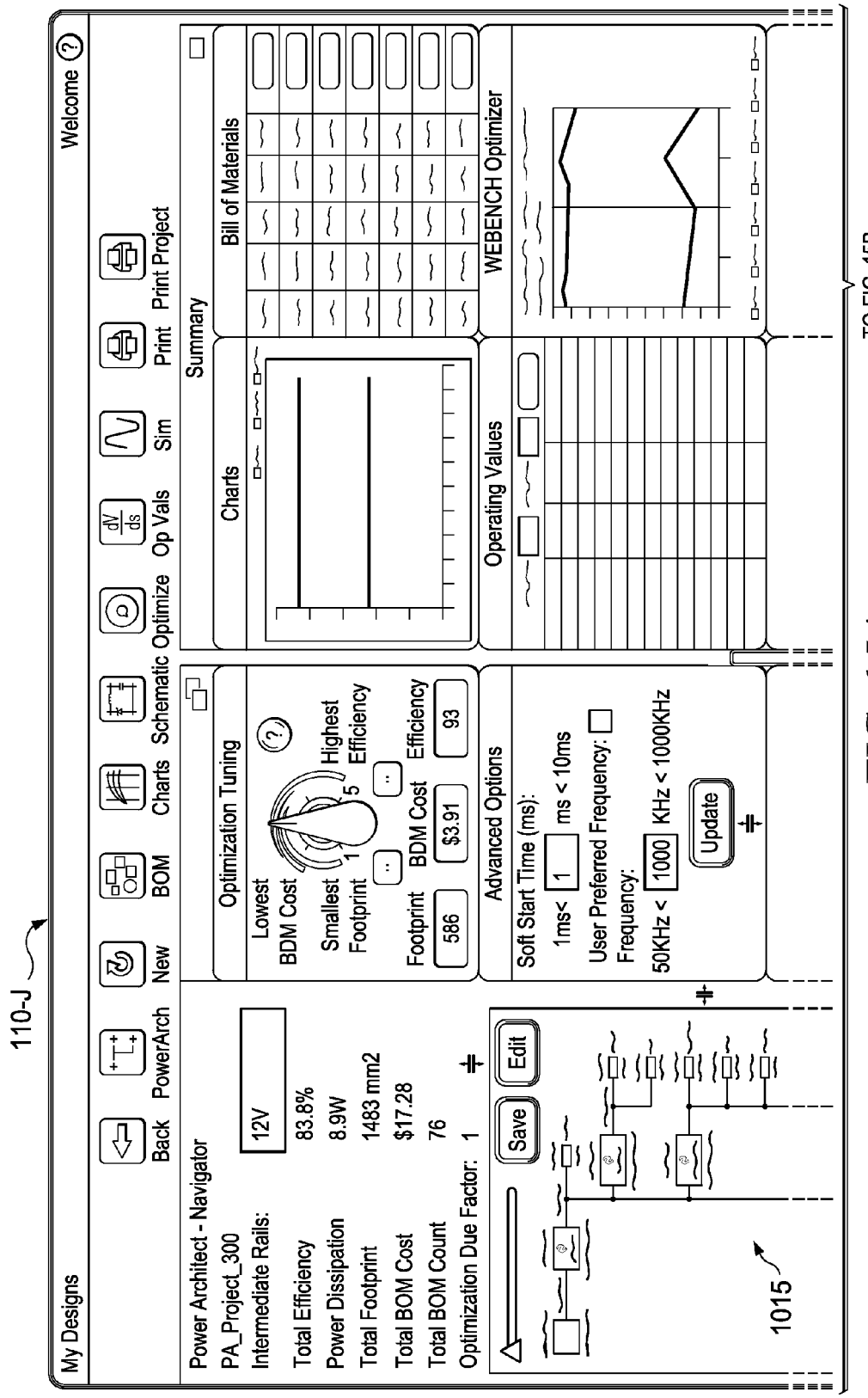
FIG. 15 illustrates an exemplary user interface illustrating a summary of information related to one of the power supply designs.
Figure 15B:
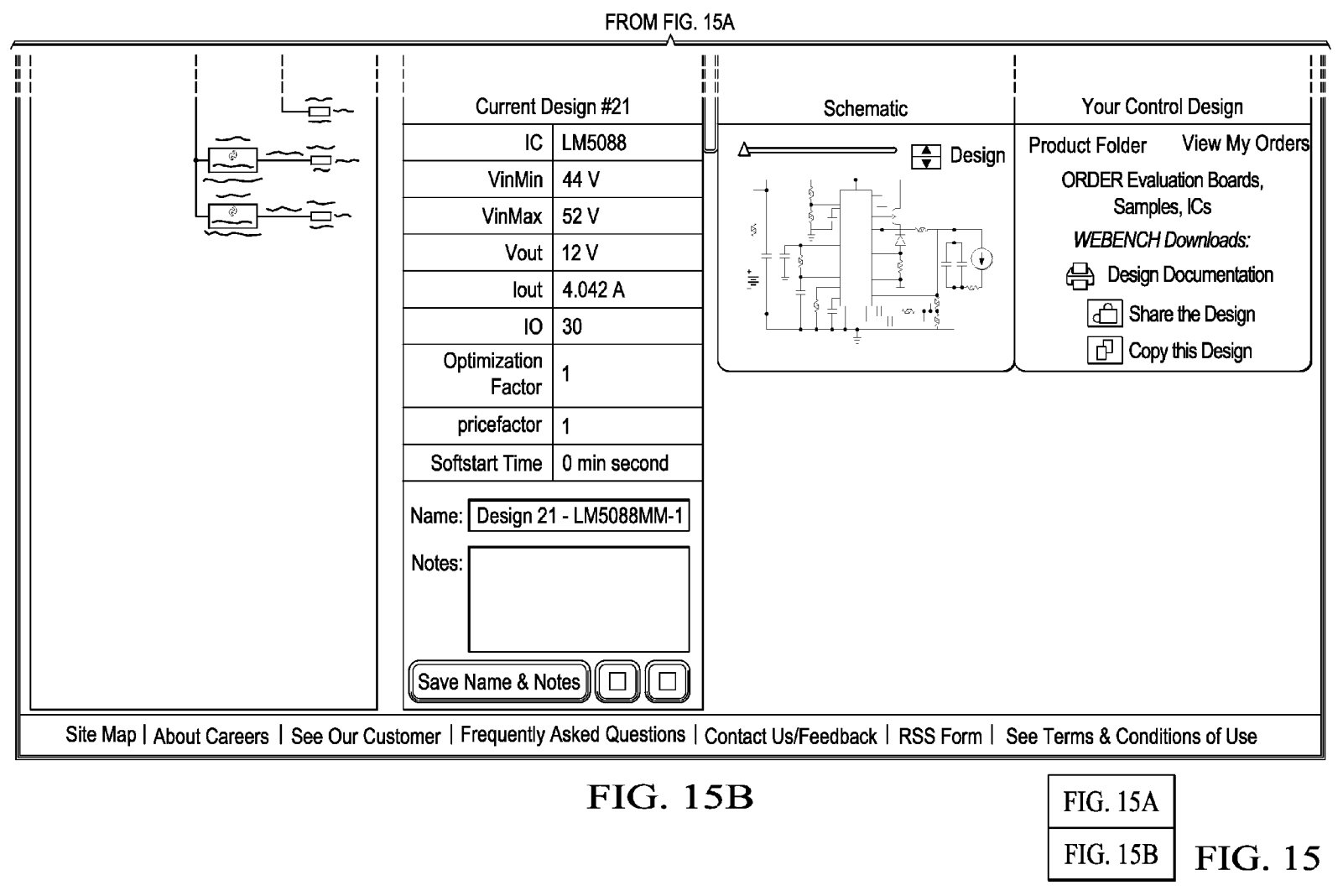

FIG. 15 illustrates an exemplary user interface 110-J illustrating a summary of information related to one of the power supply designs 125. As shown in the user interface 1104 the designed power supply design 125 has been input into the WEBENCH Power Designer circuit design tool provided by National Semiconductor for further design, review, and purchase. Accordingly, the multiple-load device power design tool application 165 may be utilized to allow for the generation of a power supply design 125 in accordance with the design requirements 130 of the user.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The invention claimed is:

1. A system adapted for generating a power supply design for a multiple-load device based on a power supply architecture including multiple power supply components satisfying load requirements for multiple loads, comprising:
    a database configured to store information including operational characteristics of a plurality of power supply components, and design constraints for the multiple-load device, including sequencing of start-up and shut-down for multiple power supply components; and
    a server in communication with the database and configured to:
        receive design parameters indicative of load requirements for multiple loads of the multiple-load device to be powered;
        determine a plurality of power supply architectures, each including multiple power supply components satisfying the load requirements for the multiple loads, and the design constraints for the multiple-load device, including a supply sequence for the multiple power supply components; including
        for each power supply architecture, determine, based on the operational characteristics of the multiple power supply components and the design constraints for the multiple-load device, at least one power supply component configured to satisfy the corresponding load requirement for each associated load of the multiple-load device; and
        generate at least one power supply design for the multiple-load device based on a selected power supply architecture.

2. The system of claim 1, further comprising a user device in communication with the server and configured to send a request to the server including the design parameters; wherein the server is further configured to send the generated at least one power supply design to the user device responsive to the request.

3. The system of claim 2, wherein the user device is further configured to:
    receive filter criteria; and
    filter the generated at least one power supply design according to the filter criteria, without additional access or interaction with the database.

4. The system of claim 1, wherein the server is further configured to optimize the generated at least one power supply design in accordance with at least one design parameter indicative of a design optimization.

5. The system of claim 4, wherein the at least one design parameter indicative of a design optimization indicates to optimize for at least one of power supply efficiency, footprint size, and component cost.

6. The system of claim 5, wherein the server is further configured to:
    receive an additional design parameter indicative of a second design optimization; and
    for each one of the power supply architectures, generate at least one additional power supply design in accordance with the each one of power supply architectures accounting for the additional design optimization.

7. The system of claim 1, wherein the server is further configured to determine at least one recommended power supply design based on evaluation of the at least one power supply design against the design parameters.

8. The system of claim 1, wherein the server is further configured to determine the plurality of power supply architectures by at least one of calculating intermediate rail voltages and grouping the plurality of loads.

9. The system of claim 8, wherein server is further configured to calculate intermediate rail voltages by an algorithm configured to at least one of:

query a table for intermediate rail voltages indexed according to input voltage, load voltage, and maximum current;

calculate the intermediate rail voltages based on the duty cycle of downstream regulator targeting low, medium, and high duty cycle for the downstream supplies; and utilize at least one predefined percentage of voltage difference between an input voltage specified by the design requirements and a voltage specified for one of the plurality of power loads.

10. The system of claim 8, wherein the server is further configured to sum the current requirements for each of the loads in a grouping of loads, and include the sum in a load requirement corresponding to a position in a power supply architecture powering the grouping of loads.

11. The system of claim 1, wherein the server is further configured to:

for each power supply architecture, determine additional parts to implement a the supply sequence; and generate the at least one power supply design to include the additional parts to implement the supply sequence.

12. The system of claim 11, wherein the server is further configured to determine a subset of power supply efficiency, footprint size, bill of materials cost, and bill of materials count for the generated at least one power supply design.

13. A method adapted for generating a power supply design for a multiple-load device based on a power supply architecture including multiple power supply components satisfying load requirements for multiple loads, comprising:

receiving, at a computing device including a design tool application, design parameters indicative of load requirements for multiple loads of the multiple-load device to be powered;

receiving, at the computing device, from a database information including operational characteristics of a plurality of power supply components, and design constraints for the multiple-load device, including sequencing of start-up and shut-down for multiple power supply components in a power supply architecture for the multiple-load device;

determining, by the design tool application, a plurality of power supply architectures, each including multiple power supply components satisfying the load requirements for the multiple loads, and the design constraints for the multiple-load device, including a supply sequence for the multiple supply components; and for each power supply architecture, determining, based on the operational characteristics of the multiple power supply components, and the design constraints, at least one power supply component satisfying the corresponding load requirement for each associated load of the multiple-load device; and generating at least one power supply design for the multiple-load device based on a selected power supply architecture.

14. The method of claim 13, further comprising optimizing the generated at least one power supply design in accordance with at least one design parameter indicating a design optimization.

15. The method of claim 13, further comprising:

receiving an additional design parameter indicating a design optimization; and for each of the plurality of power supply architectures, generating at least one additional power supply design in accordance with a selected power supply architectures accounting for the additional design optimization.

16. The method of claim 13, further comprising ranking the generated at least one power supply design in accordance with at least one design parameter indicating a design optimization.

17. The method of claim 16, further comprising:

for each power supply architecture, determining additional parts to implement a the supply sequence; and generating the at least one power supply design to include the additional parts to implement the supply sequence.

18. The method of claim 13, further comprising:

calculating intermediate rail voltages capable of being used by power supply architectures; and determining the plurality of power supply architectures by utilizing different combinations of at least a subset of the intermediate rail voltages.

19. The method of claim 13, further comprising calculating intermediate rail voltages by at least one of:

querying a table for intermediate rail voltages indexed according to input voltage, load voltage, and maximum current;

calculating the intermediate rail voltages based on the duty cycle of downstream regulator targeting low, medium, and high duty cycle for the downstream supplies; and utilizing at least one predefined percentage of voltage difference between an input voltage specified by the design requirements and a voltage specified for one of the plurality of power loads.

* * * * *